(12) United States Patent
Kim et al.

(10) Patent No.: US 8,759,833 B2
(45) Date of Patent: Jun. 24, 2014

(54) THIN FILM TRANSISTOR ARRAY PANEL AND METHOD OF MANUFACTURING THE SAME

(75) Inventors: Kyung-Wook Kim, Seoul (KR); Min-Wook Park, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/535,553

(22) Filed: Jun. 28, 2012

(65) Prior Publication Data

US 2012/0267630 A1    Oct. 25, 2012

Related U.S. Application Data

(62) Division of application No. 11/449,960, filed on Jun. 9, 2006, now abandoned.

(30) Foreign Application Priority Data

| Jun. 9, 2005 | (KR) | 10-2005-0049341 |
| Sep. 7, 2005 | (KR) | 10-2005-0083188 |
| Sep. 21, 2005 | (KR) | 10-2005-0087669 |

(51) Int. Cl.
  *H01L 29/10*    (2006.01)
(52) U.S. Cl.
  USPC ............... 257/59; 257/E33.053; 438/34

(58) Field of Classification Search
  USPC .......... 257/57, 59, 66, 72, 347, 350, 351, 35, 257/E33.05
  See application file for complete search history.

(56) References Cited

U.S. PATENT DOCUMENTS

| 6,940,567 B2 | 9/2005 | Choi |
| 2004/0051103 A1 | 3/2004 | Hong et al. |
| 2004/0051823 A1 | 3/2004 | Choi |
| 2004/0238825 A1 | 12/2004 | Lim et al. |

FOREIGN PATENT DOCUMENTS

| JP | 08234236 | 9/1996 |
| JP | 2001264818 | 9/2001 |
| KR | 1020040026003 | 3/2004 |

*Primary Examiner* — Tony Tran
(74) *Attorney, Agent, or Firm* — Cantor Colburn LLP

(57) ABSTRACT

A thin film transistor ("TFT") array panel is provided. The TFT array panel includes an insulation substrate, a gate line formed on the insulation substrate and including a gate electrode, a data line insulated from and intersecting the gate line, and including a source electrode, a drain electrode opposite to the source electrode on the gate line, and a semiconductor formed in a layer between the data line and the gate line, and having a protruding portion extending below the drain electrode, wherein a portion of the semiconductor extending towards the drain electrode, from an area occupied by the data line, is positioned within an occupying area of the gate line including the gate electrode.

14 Claims, 25 Drawing Sheets

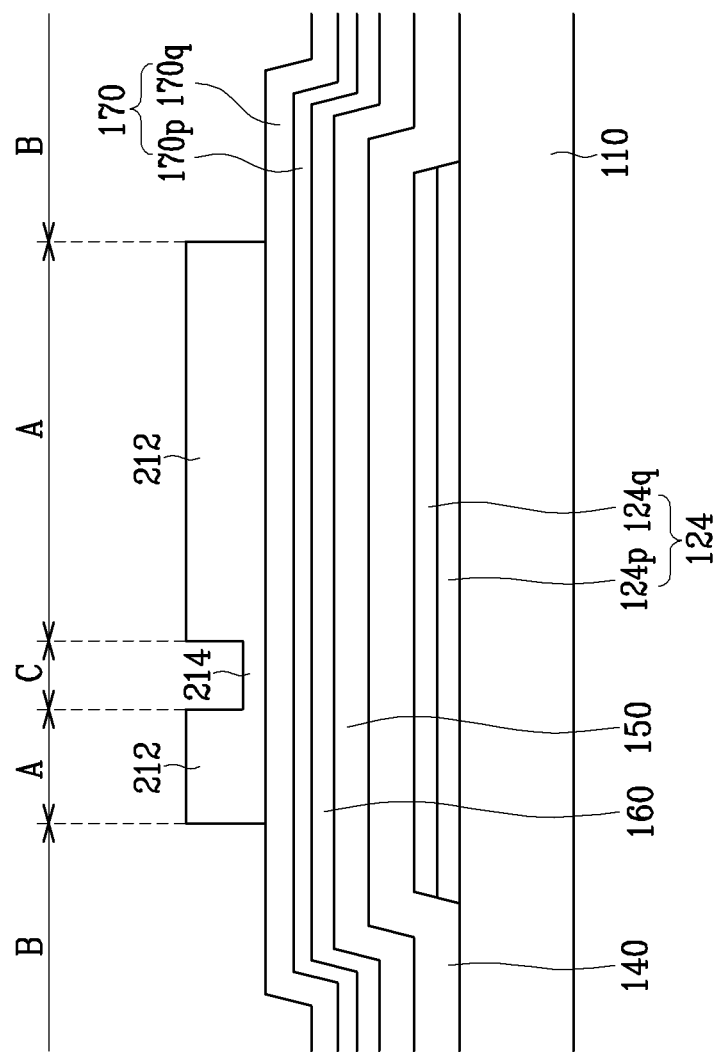

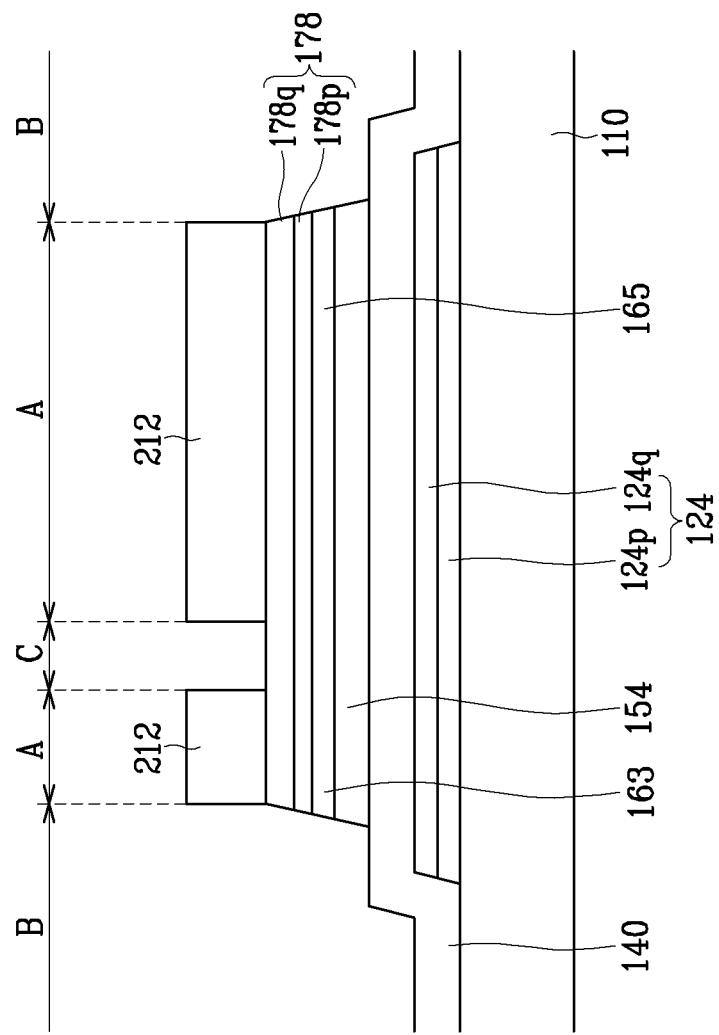

THIN FILM TRANSISTOR ARRAY PANEL AND METHOD OF MANUFACTURING THE SAME

CROSS REFERENCE TO RELATED APPLICATIONS

This application is a divisional application of U.S. application Ser. No. 11/449,960, filed Jun. 9, 2006, which claims priority to and the benefit of Korean Patent Application No. 10-2005-0087669 filed on Sep. 21, 2005; and Korean Patent Application No. 10-2005-0083188 filed on Sep. 7, 2005; and Korean Patent Application No. 10-2005-0049341 filed on Jun. 9, 2005, the entire contents of each being incorporated herein by reference.

BACKGROUND OF THE INVENTION (a) Field of the Invention

The present invention relates to a thin film transistor ("TFT") array panel and a method of manufacturing the TFT array panel. More particularly, the present invention relates to a TFT array panel capable of preventing generation of leakage current and a method of manufacturing the TFT array panel.

(b) Description of the Related Art

The thin film transistor ("TFT") array panel is used as a circuit board for independently driving each pixel in a liquid crystal display ("LCD") or an organic electro luminescence ("EL") display, etc. The TFT array panel is provided with gate lines for transferring a scanning signal and data lines for transferring an image signal and includes TFTs that are connected to the gate lines and the data lines, pixel electrodes that are connected to the TFTs, a gate insulating layer that covers the gate lines to insulate the gate lines, and a passivation layer that covers the TFTs and the data lines to insulate the TFTs and the data lines. Each TFT includes a gate electrode, which is a part of a gate line, a semiconductor for forming a channel, a drain electrode and a source electrode, which is part of the data line, a gate insulating layer, and a passivation layer, etc. The TFT is a switching element for transferring or intercepting an image signal that is passed through the data line to the pixel electrode depending on a scanning signal that is passed through the gate line.

Several photolithography processes are required to manufacture the TFT array panel. However, as the number of the photolithography processes increases, a manufacturing process becomes increasingly complicated and a manufacturing cost also increases.

BRIEF SUMMARY OF THE INVENTION

The present invention provides a thin film transistor ("TFT") array panel having advantages of little to no current (leakage current) when a TFT is turned off. A leakage current is generated due to characteristics of an element itself or external factors. Particularly, when a semiconductor layer constituting the TFT receives light, a leakage current greatly increases by generating of photoelectrons. Thus, to solve this problem, exemplary embodiments of the present invention cover a semiconductor constituting the TFT with a gate metal.

Also, exemplary embodiments of the present invention provide for a method that reduces the number of photolithography processes that are required for manufacturing the TFT array panel.

An exemplary embodiment of the present invention provides a TFT array panel including an insulation substrate, a gate line formed on the insulation substrate and including a gate electrode, a data line insulated from and intersecting the gate line, and including a source electrode, a drain electrode disposed opposite to the source electrode on the gate line, and a semiconductor formed in a layer between the data line and the gate line, the semiconductor having a protruding portion extending below the drain electrode, wherein a portion of the semiconductor extending towards the drain electrode, from an area occupied by the data line, is positioned within an occupying area of the gate line including the gate electrode.

The drain electrode may be positioned within an occupying area of the semiconductor, and the protruding portion of the semiconductor may be positioned within the occupying area of the gate line including the gate electrode.

The TFT array panel may further include a pixel electrode connected to the drain electrode and the pixel electrode may have a branch portion extended toward the drain electrode and the branch portion may be connected to the drain electrode, such that only the branch portion of the pixel electrode may overlap with the gate line.

The pixel electrode may come in contact with an upper surface and a side surface of the drain electrode and the pixel electrode may come in contact with the semiconductor.

A combined outer periphery of the drain electrode, source electrode, and a channel portion between the drain electrode and the source electrode may match an outer periphery of the protruding portion of the semiconductor.

The protruding portion of the semiconductor may be blocked from light penetrating the insulation substrate by the gate line including the gate electrode.

Another exemplary embodiment of the present invention provides a TFT array panel including an insulation substrate, a gate line formed on the insulation substrate and including a gate electrode, a gate insulating layer formed on the gate line, a semiconductor stripe formed on the gate insulating layer and having a protruding portion, a data line formed on the semiconductor stripe, and intersecting the gate line, and including a source electrode, a drain electrode formed on a protruding portion of the semiconductor stripe, a passivation layer formed on the data line and the drain electrode and having a contact hole exposing the drain electrode, and a pixel electrode formed on the passivation layer and connecting to the drain electrode through the contact hole, wherein a portion of the semiconductor stripe extending toward the drain electrode, from an area occupied by the data line, is positioned within an occupying area of the gate line including the gate electrode.

The drain electrode may be positioned within an occupying area of the semiconductor stripe, and the protruding portion of the semiconductor stripe may be positioned within an occupying area of the gate line including the gate electrode.

The pixel electrode may have a branch portion extended toward the drain electrode, the branch portion may be connected to the drain electrode, and only the branch portion of the pixel electrode may overlap with the gate line.

The contact hole may expose the drain electrode and portions of the semiconductor stripe around the drain electrode, and the pixel electrode may come in contact with an upper surface and a side surface of the drain electrode exposed through the contact hole, and may further come in contact with the portions of the semiconductor stripe that are exposed through the contact hole.

The pixel electrode may have a branch portion, the branch portion may be connected to the drain electrode and the semiconductor, and only some of the portions of the semiconductor stripe exposed through the contact hole may be covered with the pixel electrode.

A combined outer periphery of the drain electrode, source electrode, and a channel portion between the drain electrode and the source electrode may match an outer periphery of the protruding portion of the semiconductor stripe.

The protruding portion of the semiconductor stripe may be blocked from light penetrating the insulation substrate by the gate line including the gate electrode.

Another exemplary embodiment of the present invention provides a method of manufacturing a thin film transistor array panel including forming a gate line and a gate electrode on an insulation substrate, forming a semiconductor layer and a data metal layer on the gate line and gate electrode on the insulation substrate, and forming a semiconductor stripe and a protruding portion from the semiconductor layer and a data line, source electrode, and drain electrode from the data metal layer using one mask, wherein forming the semiconductor stripe and protruding portion may include forming the protruding portion within an area occupied by the gate line and gate electrode.

The method may further include forming an ohmic contact layer between the semiconductor layer and the data metal layer, and forming an ohmic contact pattern from the ohmic contact layer using the one mask.

BRIEF DESCRIPTION OF THE DRAWINGS

The above and other features and advantages of the present invention will become more apparent by describing exemplary embodiments thereof with reference to the accompanying drawings, in which:

FIGS. 8A and 8B are cross-sectional views of the exemplary TFT array panel taken along lines VIIIA-VIIIA and VIIIB-VIIIB of FIG. 7;

FIGS. 9A, 10A, and 11A and FIGS. 9B, 10B, and 11B are cross-sectional views of the exemplary TFT array panel taken along lines VIIIA-VIIIA and VIIIB-VIIIB of FIG. 7 and illustrate exemplary steps subsequent to the exemplary step shown in FIGS. 8A and 8B;

DETAILED DESCRIPTION OF THE INVENTION

Figure 1:
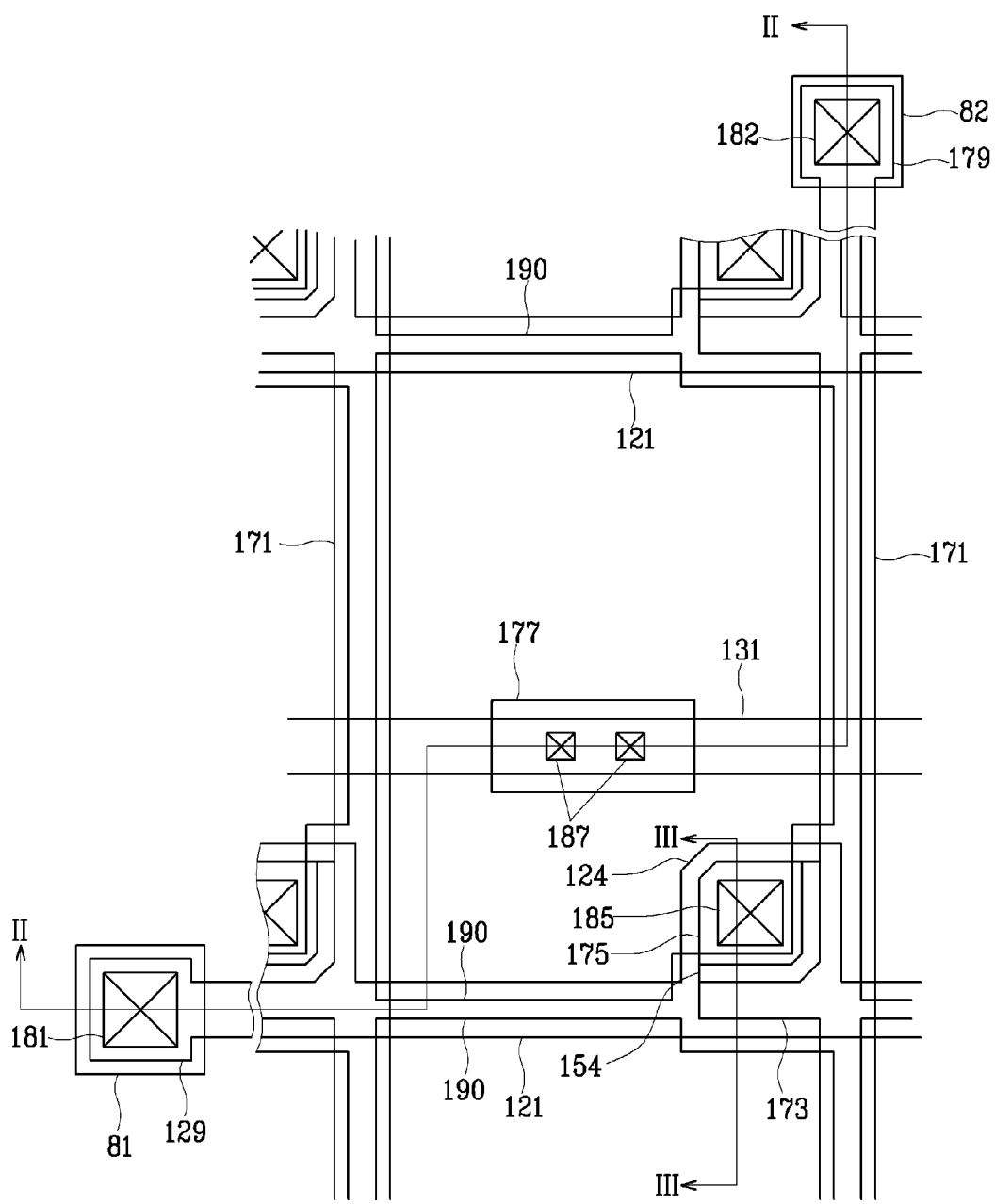
FIG. 1 is a layout view of an exemplary thin film transistor ("TFT") array panel according to an exemplary embodiment of the present invention.

The present invention now will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc. are exaggerated for clarity. Like reference numerals designate like elements throughout the specification. It will be understood that when an element such as a layer, film, region or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

A thin film transistor ("TFT") array panel for a liquid crystal display ("LCD") according to exemplary embodiments of the present invention will now be described.

Figure 2:
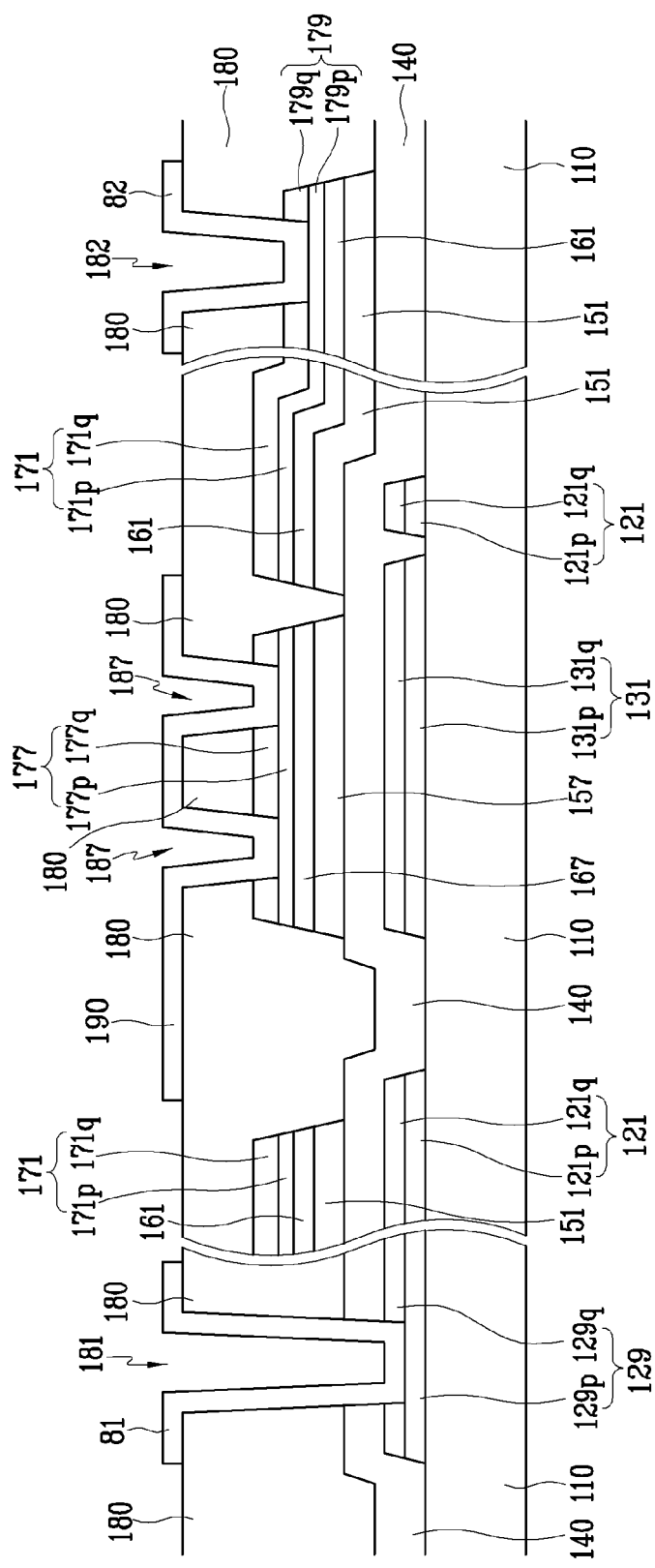
FIGS. 2 and 3 are cross-sectional views of the exemplary TFT array panel taken along lines II-II and III-III of FIG. 1.
Figure 3:
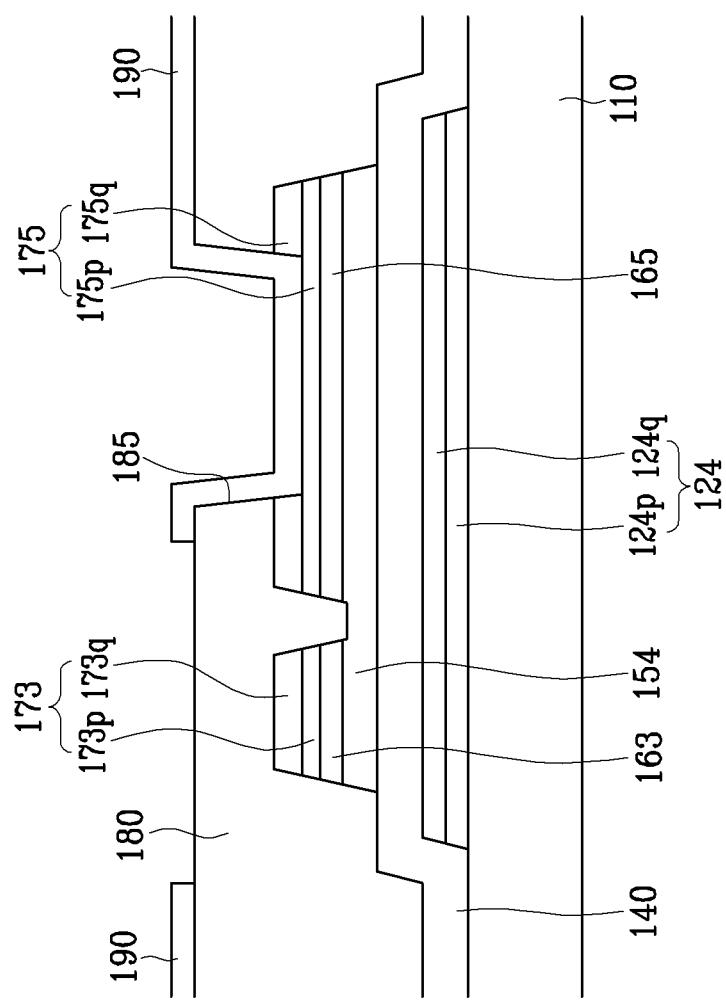

FIG. 1 is a layout view of an exemplary TFT array panel according to an exemplary embodiment of the present invention and FIGS. 2 and 3 are cross-sectional views of the exemplary TFT array panel taken along lines II-II and III-III of FIG. 1.

As shown in FIGS. 1 to 3, in a layered structure of the TFT array panel for an LCD according to an exemplary embodiment of the present invention, on an insulation substrate 110, a plurality of gate lines 121, extending in a first direction, including an extension portion 129, having an extended width in order to connect an outside apparatus, and a plurality of gate electrodes 124 is formed, and a plurality of storage electrode lines 131, also extending in the first direction, that is electrically separated from the gate lines 121 is formed.

Each gate line 121 and storage electrode line 131 includes two layers, i.e., lower layers 121p, 124p, and 131p and upper layers 121q, 124q, and 131q having a different physical property. The upper layer 121q of the gate line 121, the upper layer 124q of the gate electrode 124, and the upper layer 131q of the storage electrode line 131 are made of a metal having low resistivity, for example, aluminum metals such as aluminum (Al) or aluminum alloy to reduce a delay or a voltage drop of the gate signal. Alternatively, the lower layer 121p of the gate line 121, the lower layer 124p of the gate electrode 124, and the lower layer 131p of the storage electrode line 131 are made of materials, for example, molybdenum (Mo), molybdenum alloy, chromium (Cr), tantalum (Ta), titanium (Ti), etc. having good physical, chemical, and electrical contact characteristics with other materials, particularly, indium tin oxide ("ITO") and indium zinc oxide ("IZO"). A combination of the lower layers 121p, 124p, 131p and the upper layers 121q, 124q, and 131q includes, for example, chromium/aluminum-neodymium (Nd) alloy.

The storage electrode line 131, including the lower layer 131p and the upper layer 131q, receives a predetermined voltage such as a common voltage from the outside. When a sustain capacity generated by overlapping of a pixel electrode 190 and the gate line 121 is sufficient, the storage electrode line 131 may be omitted. In this case, a storage capacitor conductor 177, as will be further described below, may also be omitted.

Each side surface of the lower layers 121p, 124p, and 131p and the upper layers 121q, 124q, and 131q of the gate line 121, the gate electrode 124, and the storage electrode line 131 are inclined and an inclination angle thereof is about 30° to about 80° with respect to a surface of the insulation substrate 110.

A gate insulating layer 140 that is made of, for example, silicon nitride, is formed on the gate line 121, the gate electrode 124, the storage electrode line 131, and exposed portions of the insulation substrate 110.

In the upper part of the gate insulating layer 140, a plurality of semiconductor stripes 151 that is made of hydrogenated amorphous silicon ("a-Si") or the like is formed. The semiconductor stripes 151 are mainly extended in a vertical direction, a second direction substantially perpendicular to the first direction, and a plurality of protruding portions 154 for covering the gate electrodes 124 by extending in a basin form from the semiconductor stripes 151 is formed. Furthermore, semiconductor islands 157 for covering a part of the storage electrode line 131 are formed.

The protruding portion 154 of the semiconductor stripe 151 is overlapped with the gate electrode 124 and is formed to be provided within an occupying area of the gate line 121 including the gate electrode 124 among surfaces of the insulation substrate 110. In other words, the protruding portion 154 is provided within an area occupied by the gate electrode 124. That is, an edge of the protruding portion 154 of the semiconductor stripe 151 has a footprint provided within an area that is enclosed with an edge line of the gate line 121 including the gate electrode 124.

Therefore, when viewed from the lower side of the insulation substrate 110, the protruding portion 154 is not exposed because it is covered by the gate electrode 124 and the gate line 121.

In the upper part of the semiconductor 151, in a layer overlapping the semiconductor 151, a plurality of ohmic contact stripes and islands 161, 165, and 167 that are made of a material such as n+ hydrogenated a-Si in which silicide or n-type impurity is doped with a high concentration are formed. The ohmic contact stripes (contact member) 161 has a plurality of protruding portions 163, and the protruding portions 163 and the ohmic contact islands (contact member) 165 are formed in pairs, with each pair positioned on a protruding portion 154 of the semiconductor stripe 151. On the other hand, the ohmic contact island (contact member) 167 is formed on the semiconductor island 157.

Side surfaces of the semiconductors 151 and 157 and the ohmic contacts 161, 165, and 167 are also inclined with respect to the insulation substrate 110 and an inclination angle thereof is about 30° to about 80°.

A plurality of data lines 171, a plurality of drain electrodes 175, and a plurality of storage capacitor conductors 177 are formed on the ohmic contacts 161, 165, and 167 and on the gate insulating layer 140.

Each data line 171 is mainly extended in a vertical direction, the second direction, to intersect the gate lines 121 and transfers a data voltage. Each data line 171 includes an extension portion 179 having a wide width so as to connect to an outside apparatus. Most of each data line 171 is positioned within the display area, but the extension portion 179 of the data line 171 is positioned in a peripheral area.

A plurality of branches extended in a branch shape from each data line 171 and towards the drain electrode 175 forms a source electrode 173. A pair of a source electrode 173 and a drain electrode 175 is separated from each other and is positioned on an opposite side of a gate electrode 124.

Here, the data line 171, the drain electrode 175, and the storage capacitor conductor 177 are completely positioned on an upper surface of the ohmic contacts 161, 165, and 167. Particularly, the drain electrode 175 has substantially the same plane shape as the ohmic contact island 165 that is completely positioned on the protruding portion 154 of the semiconductor stripe 151. Therefore, an edge of the drain electrode 175 is provided within an area that is enclosed with an edge line of the protruding portion 154 of the semiconductor stripe 151. That is, a peripheral projection or footprint of the drain electrode 175 falls within a periphery of the protruding portion 154 of the semiconductor stripe 151. When viewed from the lower side of the insulation substrate 110, the drain electrode 175 is not exposed since it is covered by the gate electrode 124 and the gate line 121.

The gate electrode 124, the source electrode 173, the drain electrode 175, and the protruding portion 154 of the semiconductor stripe 151 constitutes a TFT and a channel of the TFT is formed in the protruding portion 154 between the source electrode 173 and the drain electrode 175.

The storage capacitor conductor 177 is overlapped with a portion of the storage electrode line 131 and is formed on the semiconductor island 157 and the ohmic contact island 167.

The data line 171 including source electrode 173 and extension portion 179, the drain electrode 175, and the storage capacitor conductor 177 may include two conductive layers, i.e., lower layers 171p, 173p, 175p, 177p, and 179p and upper layers 171q, 173q, 175q, 177q, 179q which have a different physical property.

It is preferable that the upper layers 171q, 173q, 175q, 177q, 179q are made of metals having low resistivity, for example, aluminum metals, silver metals, copper metals, or so on to reduce a signal delay or a voltage drop and the lower layers 171p, 173p, 175p, 177p, 179p are made of refractory metals such as molybdenum, chromium, tantalum, and titanium or their alloy. A good example of the combination includes a chromium or molybdenum (alloy) lower layer and an aluminum (alloy) upper layer and some of the upper layer 175q of the drain electrode 175 and the upper layer 179q of the extension portion 179 of the data line 171 is removed to expose the lower layers 175p and 179p. However, the data line 171, the drain electrode 175, and the storage capacitor conductor 177 may have a single layer structure that is made of the above-mentioned several materials and may be made of other various metals or conductors.

Side surfaces of the lower layer 171p, 173p, 175p, 177p, and 179p and the upper layers 171q, 173q, 175q, 177q, and 179q of the data line 171, the source electrode 173, the drain electrode 175, the storage capacitor conductor 177, and the extension portion 179 are inclined and an inclination angle with respect to the insulation substrate 110 thereof is about 30° to about 80°, as in the gate line 121 and the storage electrode line 131.

The ohmic contacts 161, 165, and 167 are provided between the lower semiconductors 151 and 157 and the upper data line 171, drain electrode 175, and storage capacitor conductor 177 and perform a function of lowering contact resistance. The semiconductor stripe 151 has a portion, namely a portion of the protruding portion 154, that is exposed without being covered by the data line 171 and the drain electrode 175 and a portion between the source electrode 173 and the drain electrode 175, and the semiconductor island 157 is provided below the ohmic contact 167 which is below the storage capacitor conductor 177.

A passivation layer 180 that is made of an organic material having excellent planarization characteristics and photosensitivity, an insulating material having a low dielectric constant of 4.0 or less such as a-Si:C:O, a-Si:O:F, that is formed by plasma enhanced chemical vapor deposition ("PECVD"), silicon nitride, which is an inorganic material, or so on is formed on an exposed portion of the semiconductor stripe 151, the data line 171, the drain electrode 175, the storage capacitor conductor 177, and exposed portions of the gate insulating layer 140.

In the passivation layer 180, a plurality of contact holes 185, 187, and 182 for exposing lower layers 175p, 177p, and 179p of each of the drain electrode 175, the storage capacitor conductor 177, and the extension portion 179 of the data line 171 are formed. In the passivation layer 180 and the gate insulating layer 140, a plurality of contact holes 181 for exposing the lower layer 129p of the extension portion 129 of each gate line 121 is formed.

On the passivation layer 180, a plurality of pixel electrodes 190 and a plurality of contact assistants 81 and 82 are formed.

The pixel electrode 190 and the contact assistants 81 and 82 may be made of a transparent conductive material such as, but not limited to ITO or IZO.

The pixel electrode 190 is physically and electrically connected to the drain electrode 175 and the storage capacitor conductor 177 through the contact holes 185 and 187 to receive a data voltage from the drain electrode 175 and transfer a data voltage to the conductor 177.

The pixel electrode 190 to which a data voltage is applied and a common electrode of an opposing panel that receives a common voltage form an electric field, thereby rearranging liquid crystal molecules of a liquid crystal layer between the common electrode of the opposing panel and the pixel electrodes of the TFT array panel.

Furthermore, the pixel electrode 190 and the common electrode constitute a capacitor, thereby maintaining an applied voltage even after the TFT is turned off. In order to strengthen voltage sustain ability, another capacitor is connected in parallel to the liquid crystal capacitor and referred to as a "storage capacitor."

The storage capacitor is manufactured by overlapping or so on of the pixel electrode 190 and the storage electrode line 131 and increases a sustain capacity by making a distance between the storage capacitor conductor 177 and the passivation layer 180 to be small by providing the storage capacitor conductor 177 under the passivation layer 180.

The pixel electrode 190 is also overlapped with a neighboring gate line 121 and data line 171 to increase an aperture ratio, but alternatively they may not be overlapped.

Contact assistants 81 and 82 are connected to the extension portion 129 of the gate line 121 and the extension portion 179 of the data line 171, respectively through contact holes 181 and 182. The contact assistants 81 and 82 supplement adhesion between each of the extension portions 129 and 179 of the gate line 121 and the data line 171 and an outside apparatus and protect the extension portions 129 and 179.

As described above, if the protruding portion 154 of the semiconductor stripe 151 is formed to be provided within an occupying area of the gate electrode 124 and the gate line 121, backlight from a backlight assembly is intercepted by the gate electrode 124 and the gate line 121 and thus does not reach the protruding portion 154. Therefore, a leakage current, which is induced due to photoelectrons in a state where the TFT is turned off, is prevented from being generated.

Although the protruding portion 154 is illustrated as being positioned entirely within a peripheral projection of the gate electrode 124 and gate line 121, in an alternative embodiment, the entire protruding portion 154 of the semiconductor stripe 151 is not necessarily provided within an occupying area of the gate line 121 including the gate electrode 124, but it is preferable that a channel portion which is disposed between the source electrode 173 and the drain electrode 175, a portion disposed under the drain electrode 175, and portions adjacent to the portion disposed under the drain electrode 175 are formed to be disposed within the occupying area of the gate line 121 including the gate electrode 124. That is, it is preferable that at least the portion of the semiconductor that is positioned toward the drain electrode 175 from the data line 171 is formed to be disposed within the occupying area of the gate line 121 including the gate electrode 124.

Now, an exemplary method of manufacturing the TFT array panel for the LCD shown in FIGS. 1, 2, and 3 according to an exemplary embodiment of the present invention will be described with reference to FIGS. 4 to 12B and FIGS. 1, 2, and 3.

Figure 4:
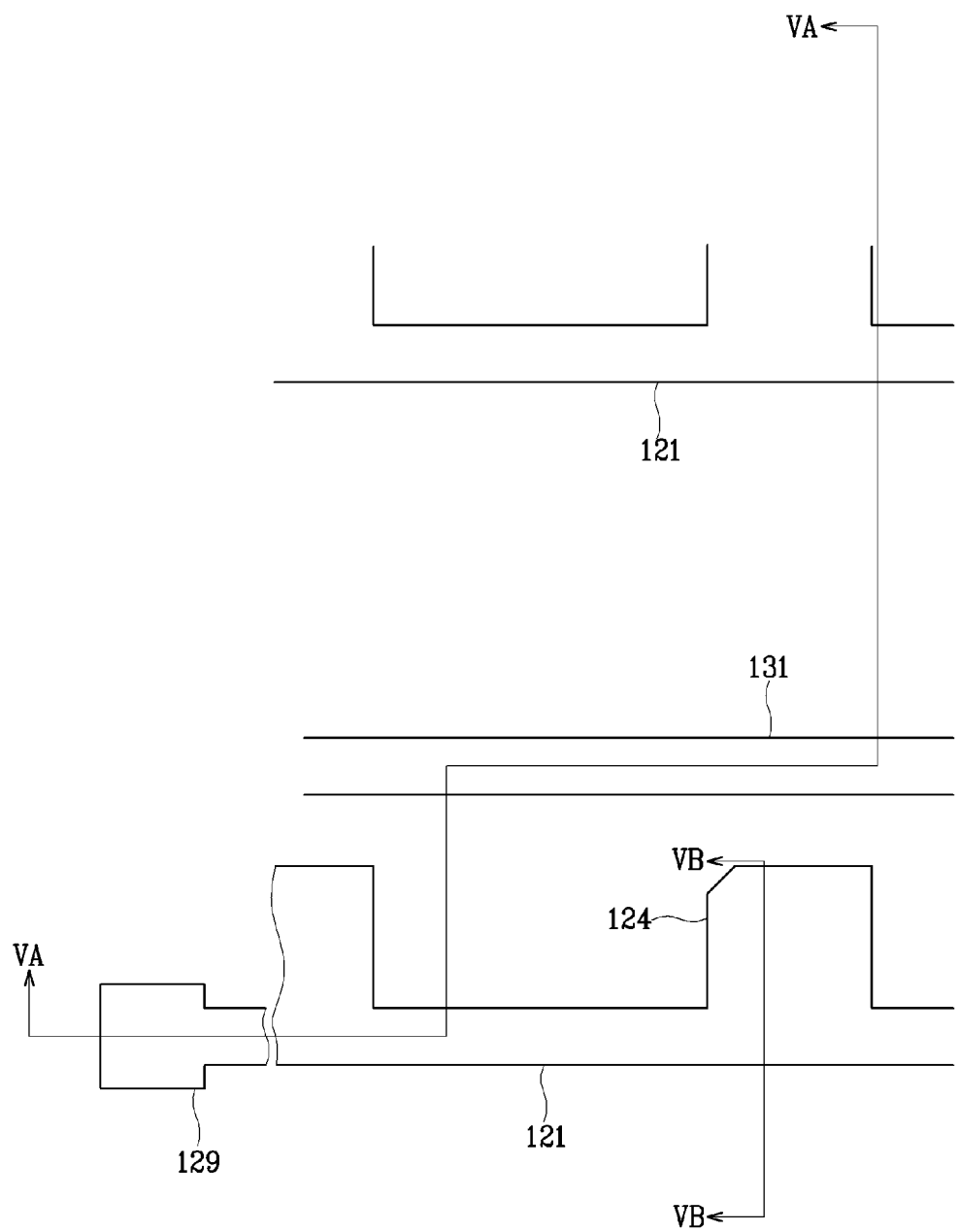
FIG. 4 is a layout view of an exemplary TFT array panel in a first exemplary step of manufacturing the exemplary ITT array panel shown in FIGS. 1 to 3.
Figure 5A:
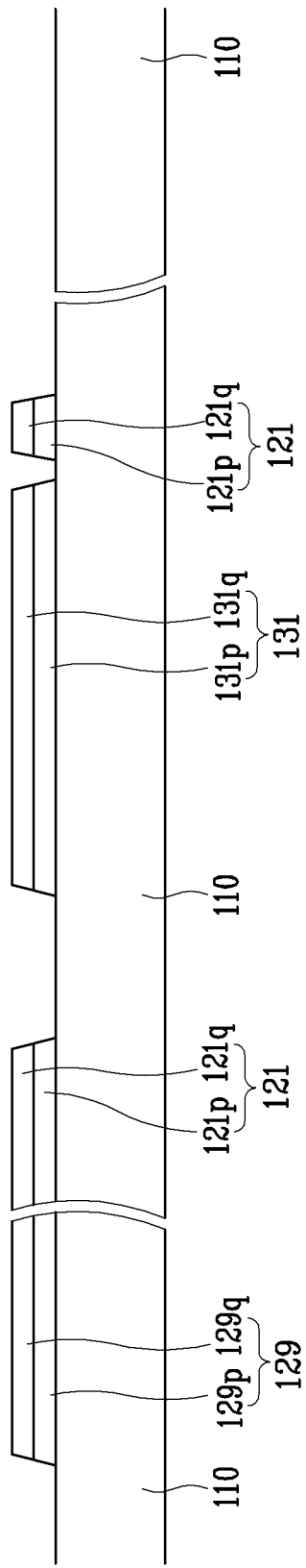
FIGS. 5A and 5B are cross-sectional views of the exemplary TFT array panel taken along lines VA-VA and VB-VB of FIG. 4.
Figure 5B:
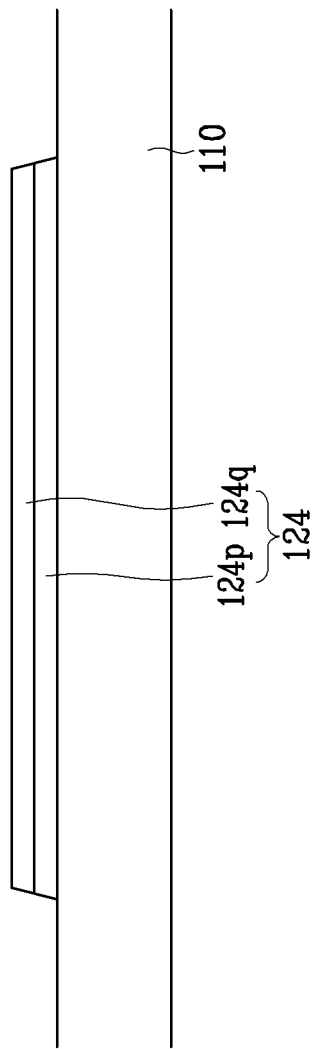
Figure 6A:
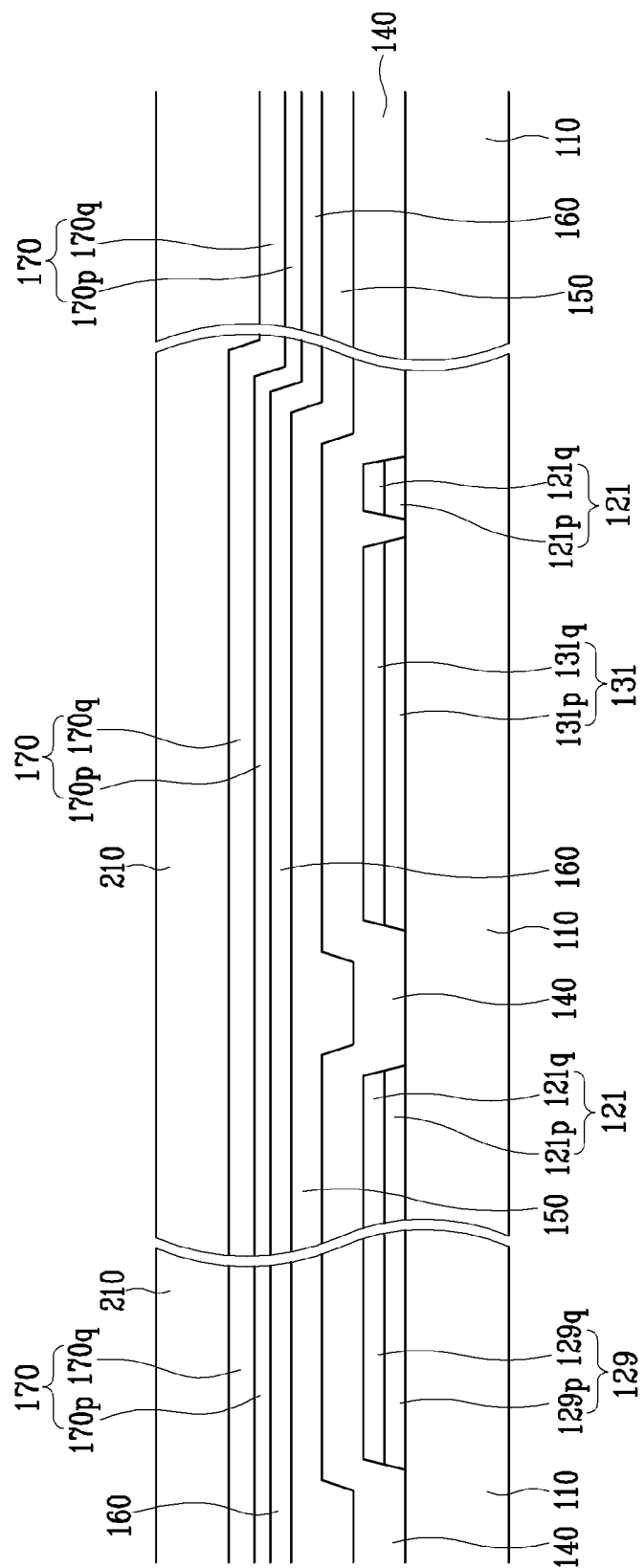
FIGS. 6A and 6B are cross-sectional views of the exemplary TFT array panel taken along lines VA-VA and VB-VB of FIG. 4 and are cross-sectional views of the exemplary ITT array panel in an exemplary step subsequent to the exemplary step shown in FIGS. 5A and 5B.
Figure 6B:
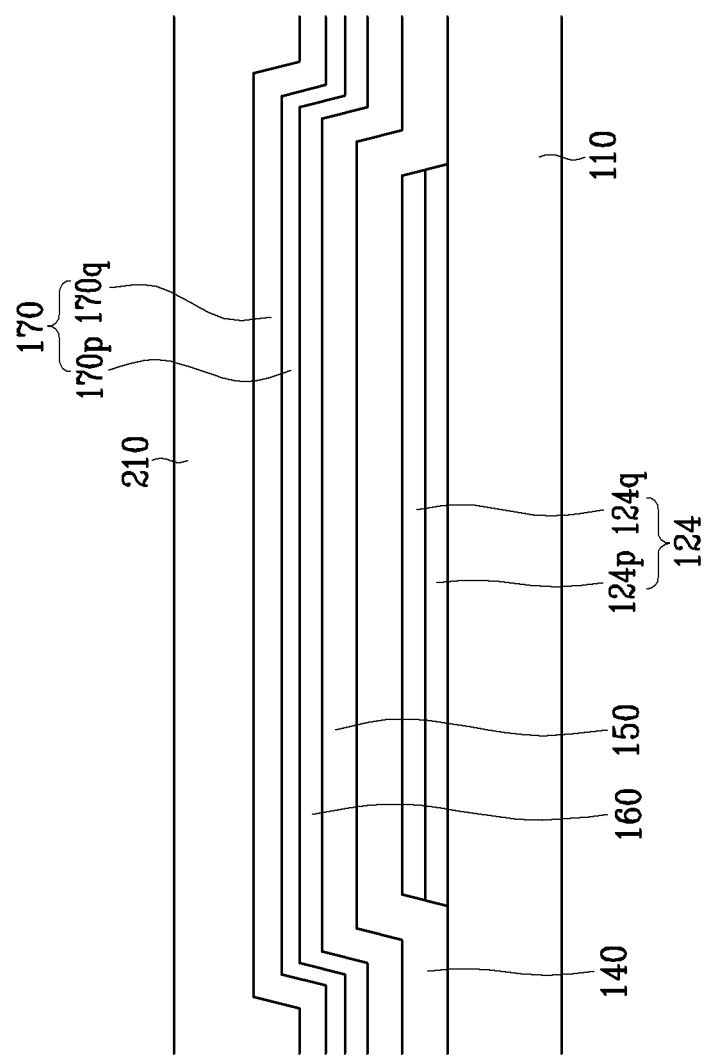
Figure 7:
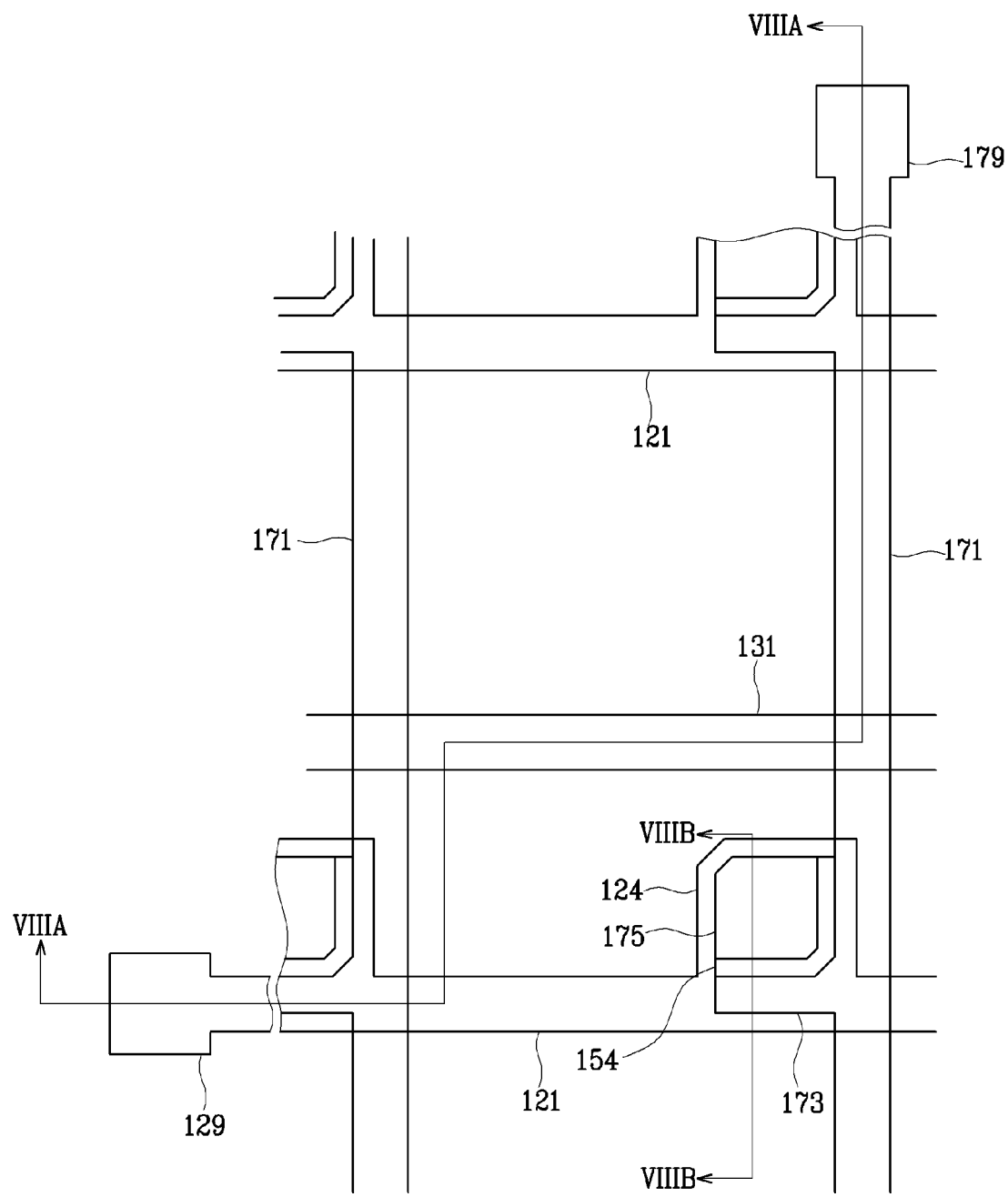
FIG. 7 is a layout view of the exemplary TFT array panel in an exemplary step subsequent to the exemplary step shown in FIGS. 6A and 6B.
Figure 8A:
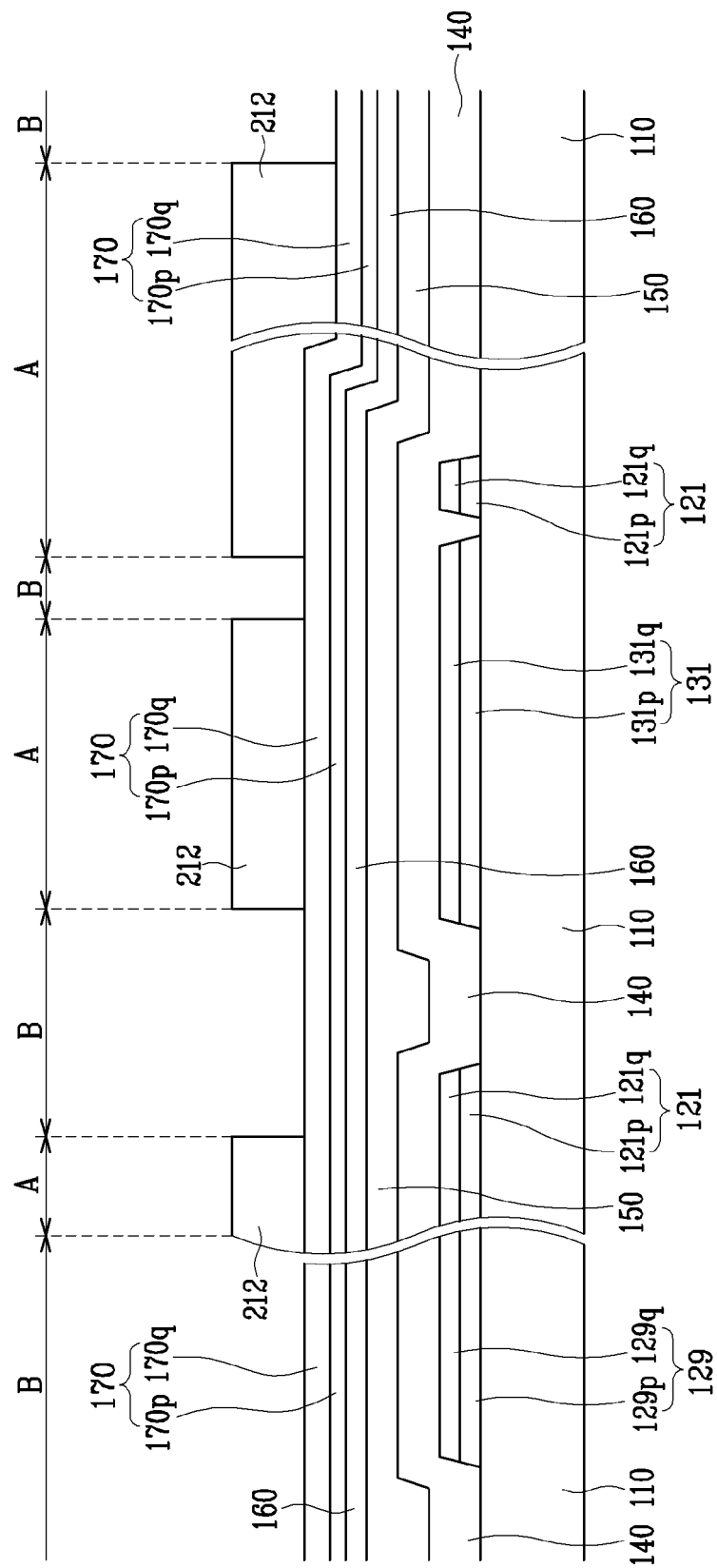

FIG. 4 is a layout view of an exemplary TFT array panel in an exemplary first step of manufacturing the exemplary TFT array panel shown in FIGS. 1 to 3. FIGS. 5A and 5B are cross-sectional views of the exemplary ITT array panel taken along lines VA-VA and VB-VB of FIG. 4. FIGS. 6A and 6B are cross-sectional views of the exemplary TFT array panel taken along lines VA-VA and VB-VB of FIG. 4 and are cross-sectional views in an exemplary step subsequent to the exemplary step shown in FIGS. 5A and 5B. FIG. 7 is a layout view of the exemplary ITT array panel in an exemplary step subsequent to the exemplary step shown in FIGS. 6A and 6B. FIGS. 8A and 8B are cross-sectional views of the exemplary TFT array panel taken along lines VIIIA-VIIIA and VIIIB-VIIIB of FIG. 7. FIGS. 9A, 10A, and 11A and FIGS. 9B, 10B, and 11B are cross-sectional views of the exemplary TFT array panel taken along lines VIIIA-VIIIA and VIIIB-VIIIB of FIG. 7 and illustrate exemplary steps subsequent to the exemplary step shown in FIGS. 8A and 8B. FIGS. 12A and 12B are cross-sectional views of the exemplary TFT array panel in an exemplary step subsequent to the exemplary step shown in FIGS. 11A and 11B.

First, two metal layers, i.e., a lower metal film and an upper metal film are sequentially stacked by sputtering on the insulation substrate 110 that is made of transparent glass, plastic, etc. In an exemplary embodiment, the upper metal layer is made of aluminum metals such as Al—Nd alloy and has a thickness of about 2,500 Å. An Al—Nd sputtering target preferably includes Nd of 2 atm %.

As shown in FIGS. 4, 5A, and 5B, by sequentially patterning the upper metal film and the lower metal film, the gate line 121s, each including a plurality of gate electrodes 124, are formed and a plurality of storage electrode lines 131, that are electrically separated from the gate lines 121, are formed.

Next, as shown in FIGS. 6A and 6B, a gate insulating layer 140, an intrinsic amorphous silicon layer 150, and an impurity amorphous silicon layer 160, that are made, for example, of silicon nitride are continuously stacked, then two metal layers 170, i.e., a lower layer 170p and an upper layer 170q are sequentially stacked by sputtering, and then a photosensitive film 210 is coated thereon. Thereafter, light is irradiated in the photosensitive film 210 through a light mask and then the photosensitive film 210 is developed. As shown in FIGS. 8A and 8B, a thickness of the developed photosensitive film varies depending on a position thereof. In the illustrated embodiment, a channel portion C, as shown in FIG. 8B, includes a first portion 214 of the photosensitive film patterns 212 and 214 that is positioned between locations corresponding to the source electrode 173 and the drain electrode 175 and is formed to have a smaller thickness than a second portion 212 of the photosensitive film patterns 212 and 214 that is positioned in a portion A in which a data line 171 will be formed. Photosensitive films of the remaining portions B are removed. At this time, a ratio of a thickness of the photosensitive film 214 remaining in the channel portion C and a thickness of the photosensitive film 212 remaining in the portions A should be differently set depending on a process condition in an etching process as will be further described below, but, in one exemplary embodiment, a thickness of the first portion 214 is set to ½ or less than that of the second portion 212.

There are several methods of changing a thickness of the photosensitive film depending on a position and the methods include, for example, a method of providing a transparent region, a light blocking region, and a translucent region in an exposure mask. A slit pattern, a lattice pattern, or a thin film having middle transmittance or a middle thickness may be provided in the translucent region. When the slit pattern is used, it is preferable that a slit width or a space between slits is smaller than resolution of a light exposure for use in a picture process. Another example is to use a photosensitive film that can reflow. That is, after forming a photosensitive film that can reflow with a normal mask having only both of a transparent region and a light blocking region, a thin portion is formed by reflowing the formed photosensitive film in a region in which the photosensitive film does not remain.

Thereafter, an etching process for photosensitive film patterns 212 and 214 and the lower films is performed. At this time, the data line 171 and the lower films should remain in portion A, only the semiconductor should remain in the channel portion C, and the gate insulating layer 140 should be exposed in the remaining portion B.

Figure 9A:
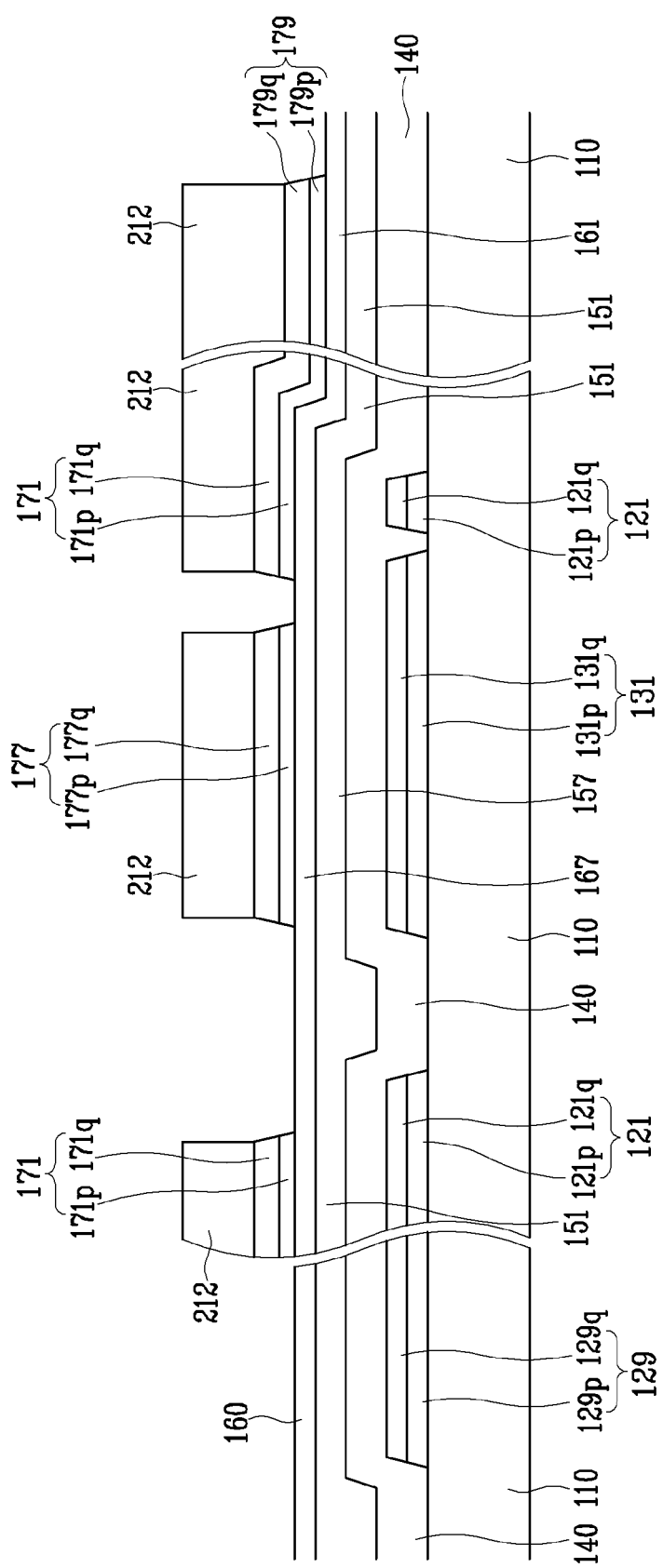
Figure 9B:
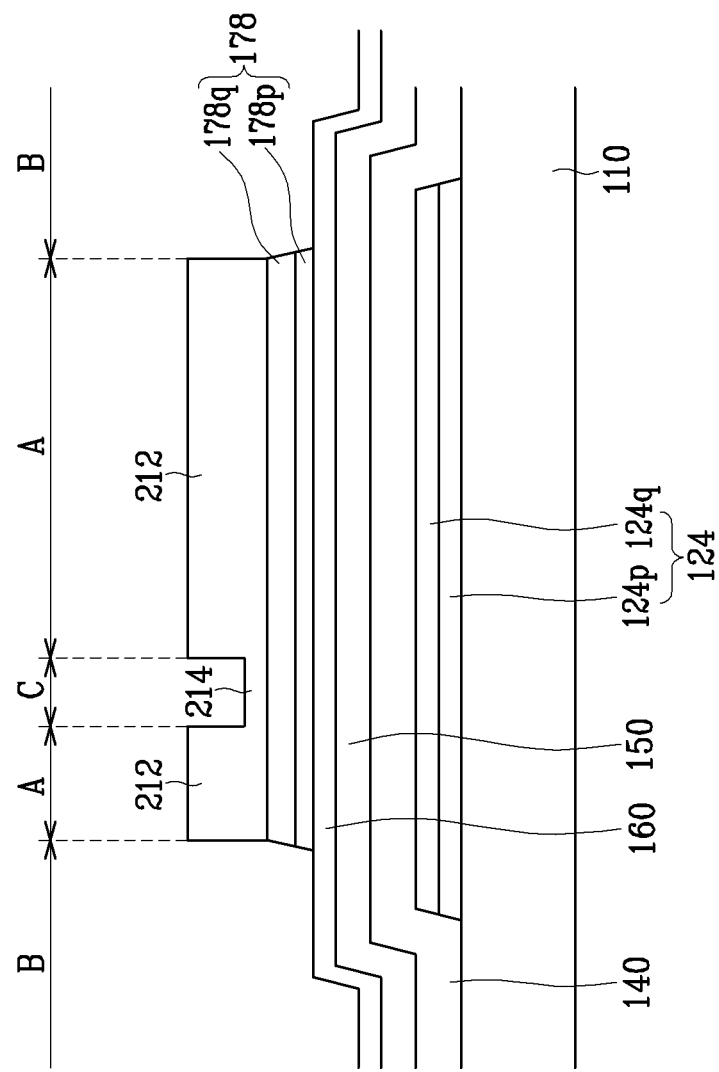

First, as shown in FIGS. 9A and 9B, the lower ohmic contact layer 160 is exposed by removing the exposed conductor in the remaining portion B. In this process, both dry and wet etching methods can be used and at this time, it is preferable that etching is performed under a condition that the conductor is etched and the photosensitive films 212 and 214 are almost not etched. However, it is difficult to perform the dry etching under a condition of etching only a conductor and not etching photosensitive films 212 and 214 and thus the dry etching can be preformed under a condition of etching both of the conductor and the photosensitive film patterns 212 and 214. In this case, the first portion 214 is removed and the lower conductor is not exposed by making a thickness of the first portion 214 to be larger than when a wet etching process is performed.

In this way, as shown in FIGS. 9A and 9B, the channel portion C and only a conductor of the A region, i.e., a source/drain conductor 178 including upper and lower layers 178q, 178p and a storage capacitor conductor 177 including upper and lower layers 177q, 177p remain, conductors of other portions are all removed, and thus the lower ohmic contact layer 160 is exposed. At this time, the source and drain electrodes 173 and 175 are not separated as in FIGS. 1 to 3, but are instead connected in the source/drain conductor 178.

Figure 10A:
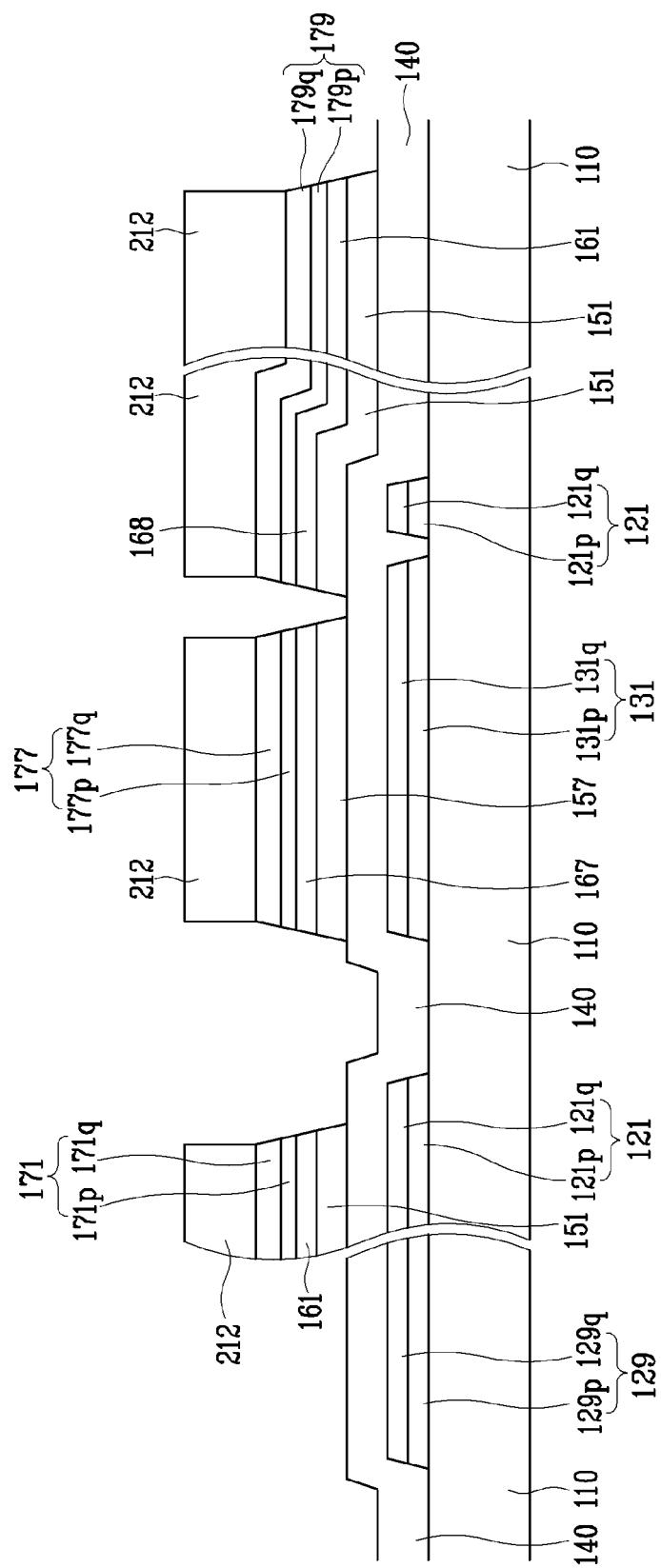

Next, as shown in FIGS. 10A and 10B, the exposed ohmic contact layer 160 of portion B, the lower semiconductor layer 150, and the first portion 214 of the photosensitive film are simultaneously removed with a dry etching method. At this time, etching should be preformed under a condition that the photosensitive films 212 and 214, the ohmic contact layer 160, and the semiconductor 150 are simultaneously etched and the gate insulating layer 140 is not etched. Particularly, it is preferable that the etching is performed under a condition that an etching ratio of the photosensitive films 212 and 214 and the semiconductor 150 is almost equal. For example, two films can be etched in an almost equal thickness when a mixed gas of SF6 and HCl or a mixed gas of SF6 and O2 is used. When an etching ratio of the photosensitive films 212 and 214 and the semiconductor layer 150 is equal, a thickness of the first portion 214 should be equal to or less than the sum of thicknesses of the semiconductor layer 150 and the ohmic contact layer 160.

In this way, as shown in FIGS. 10A and 10B, the first portion 214 of the channel portion C is removed to expose the source/drain conductor 178. On the other hand, the second portion 212 of the portion A is also etched and thus a thickness thereof becomes thinner.

Next, photosensitive film dregs remaining in the surface of the source/drain conductor 178 of the channel portion C are removed through an ashing process.

Figure 11A:
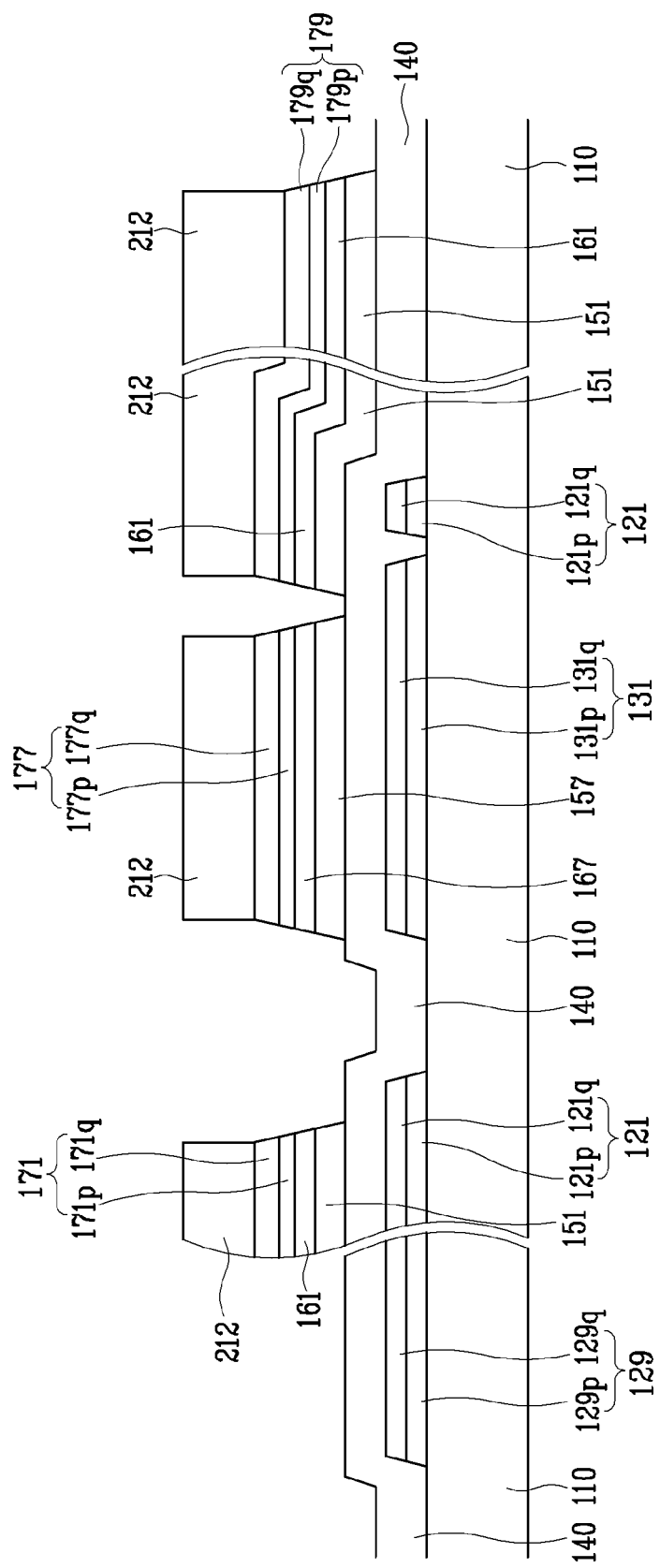
Figure 11B:
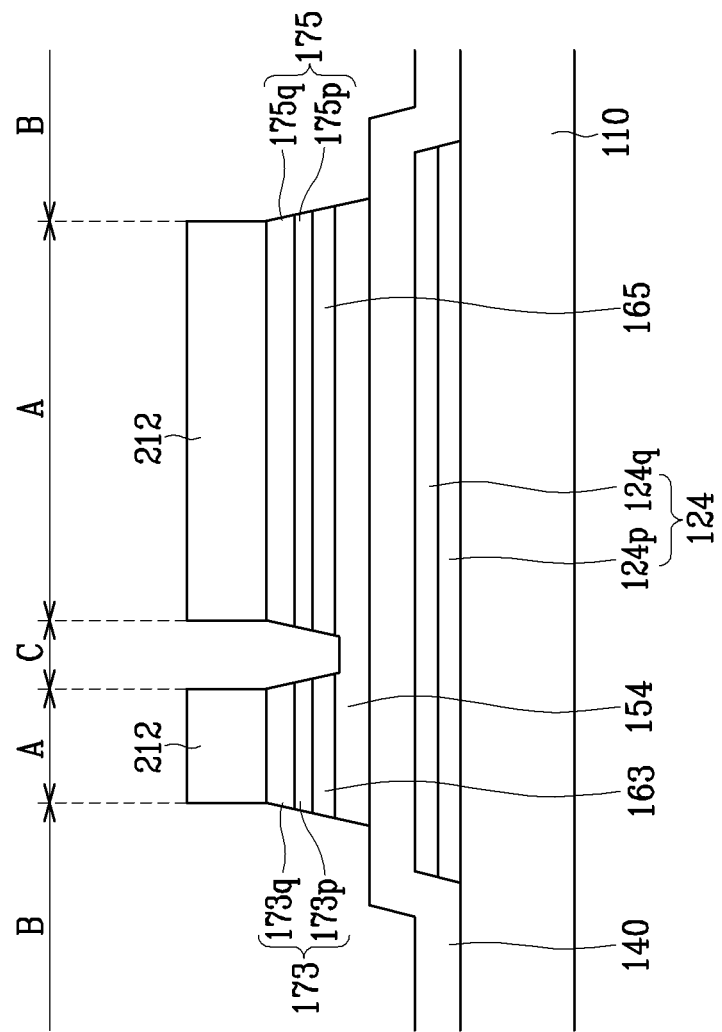
Figure 12A:
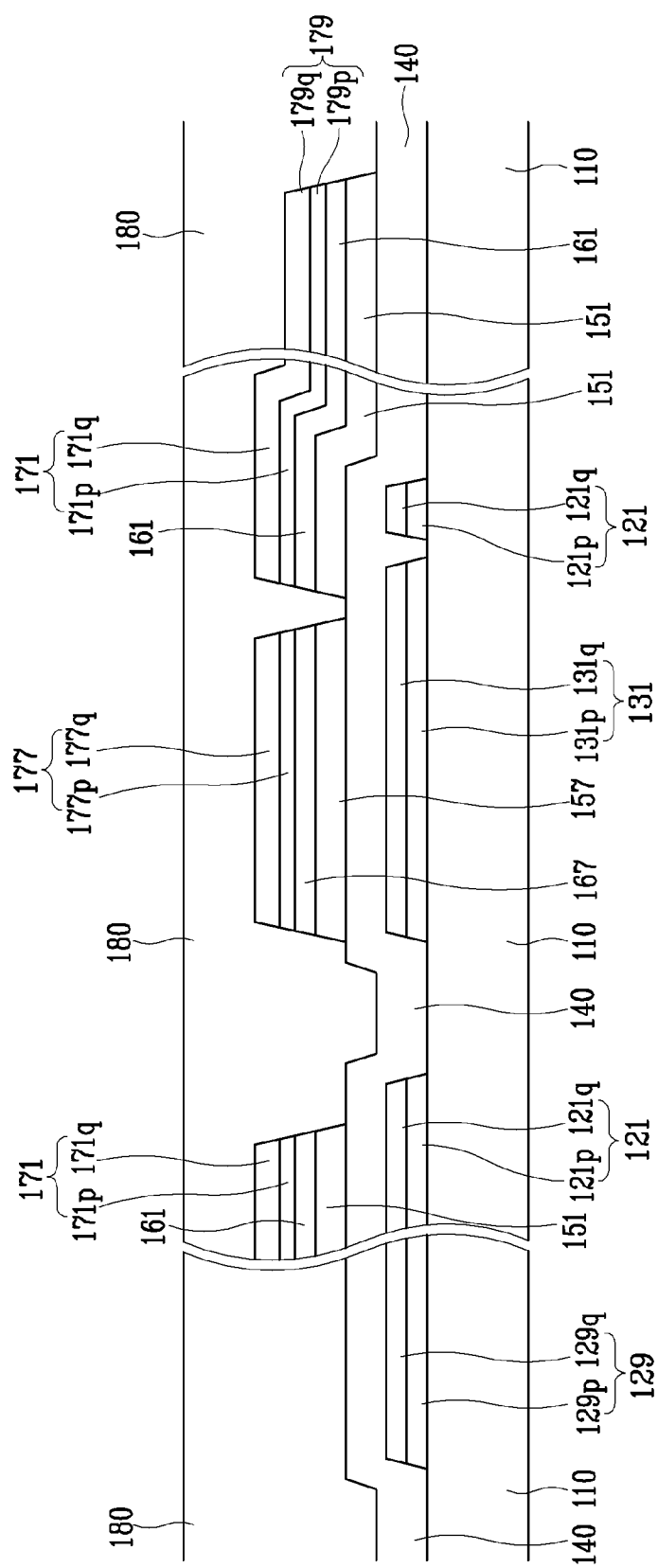
FIGS. 12A and 12B are cross-sectional views of an exemplary TFT array panel in an exemplary step subsequent to the exemplary step shown in FIGS. 11A and 11B.
Figure 12B:
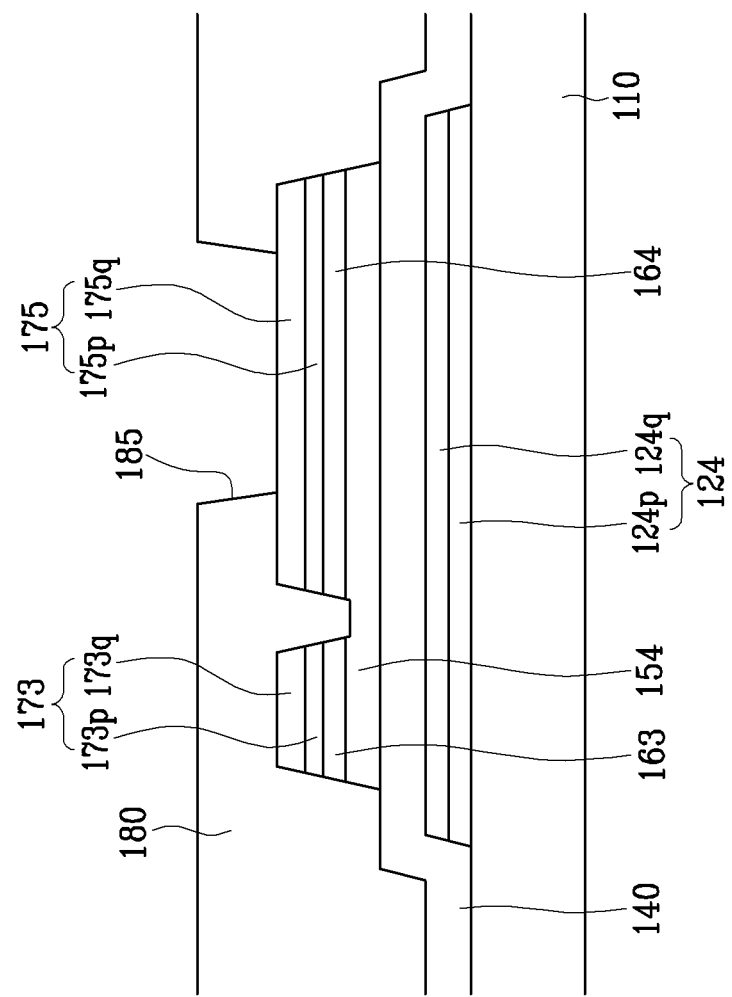

Next, as shown in FIGS. 11A and 11B, the source/drain conductor 178 and the lower ohmic contacts 163 and 165 of the channel portion C are etched and any remaining particles are removed. At this time, only dry etching may be performed for all of the source/drain conductor 178 and the ohmic contacts 163 and 165, or alternatively wet etching may be performed for the source/drain conductor 178 and dry etching may be performed for the ohmic contacts 163 and 165. In a case of the former, it is preferable to perform the etching under a condition that an etching selection ratio of the source/drain conductor 178 and the ohmic contacts 163 and 165 is large. This is because it is difficult to find an ending point of the etching when an etching selection ratio is not large, whereby it is not easy to adjust a thickness of the semiconductor remaining in the channel portion C.

In a case of the latter in which wet etching and dry etching are alternately performed, a side surface of the source/drain conductor 178 in which wet etching is performed is etched, but the ohmic contacts 163 and 165 in which dry etching is performed are almost not etched, whereby a step shape is manufactured.

Etching gases using for etching the ohmic contacts 163 and 165 and the protruding portion of the semiconductor line 154 include, for example, a mixed gas of CF4 and HCl or a mixed gas CF4 and O2, and when CF4 and O2 are used, the protruding portion 154 of the semiconductor line 151 remains in a uniform thickness.

At this time, as shown in FIG. 11B, when some of the protruding portion 154 of the semiconductor line 151 is removed, a thickness thereof may be small, and it is preferable to have a thick photosensitive film pattern so that the lower data line is not exposed when the second portion 212 of the photosensitive film pattern is etched.

In this way, the source electrode 173 and the drain electrode 175 are separated, thereby completing the data line 171 and the lower ohmic contacts 163 and 165.

Finally, the second portion 212 of the photosensitive film remaining in the portion A is removed. However, in an alternative embodiment, the second portion 212 may be removed before the lower ohmic contacts 163 and 165 are removed after the source/drain conductor 178 of the channel portion C is removed.

As described above, wet etching and dry etching may be alternately performed or only dry etching may be performed. In a case of the latter, because only one kind of etching process is performed, the process is relatively simple, but it may be difficult to find a proper etching condition. However, in a case of the former, it is relatively easy to find an etching condition, but the process is troublesome, compared to the latter.

Next, as shown in FIGS. 12A and 12B, a passivation layer 180 is formed by growing silicon nitride, a-Si:C:O film, or a-Si:O:F film with a chemical vapor deposition ("CVD") method or coating an organic insulator layer on the resultant structure.

Next, contact holes 185, 181, 182, and 187 for exposing each of the drain electrode 175, the extension portion 129 of the gate line 121, the extension portion 179 of the data line 171, and the storage capacitor conductor 177 are formed by etching the passivation layer 180 or the passivation layer 180 and the gate insulating layer 140 with a photolithography process.

Finally, as shown in FIGS. 1 to 3, by performing a deposition process and a photolithography process in an IZO layer, an ITO layer, or the like, a pixel electrode 190 that is connected to the drain electrode 175 and the storage capacitor conductor 177 and contact assistants 81 and 82 that are connected to extension portions 129 and 179 of the gate line and the data line, respectively are formed.

In an exemplary embodiment of the present invention shown in FIGS. 1, 2, and 3, data metals 171, 175, and 177, the lower contact layer patterns 161, 165, and 167, and semiconductors 151 and 157 are formed using one mask and in this process, the source electrode 173 and the drain electrode 175 are separated, thereby simplifying a manufacturing process. When this manufacturing method is used, the semiconductors 151 and 157 always exist under the data metals 171, 175, and 177. As previously described, because a leakage current increases when the semiconductor is exposed to backlight or so on, reliability of a TFT is deteriorated and a display quality of a LCD is deteriorated when the semiconductor is exposed to backlight. In order to prevent this problem, in an exemplary embodiment of the present invention, a portion of the semiconductor 151 that is positioned toward the drain electrode 175 from the data line 171 constituting the TFT, such as the protruding portion 154, and the drain electrode 175 are provided within an occupying area of the gate line 121 including the gate electrode 124.

A TFT array panel according to another exemplary embodiment of the present invention will now be described.

Figure 13:
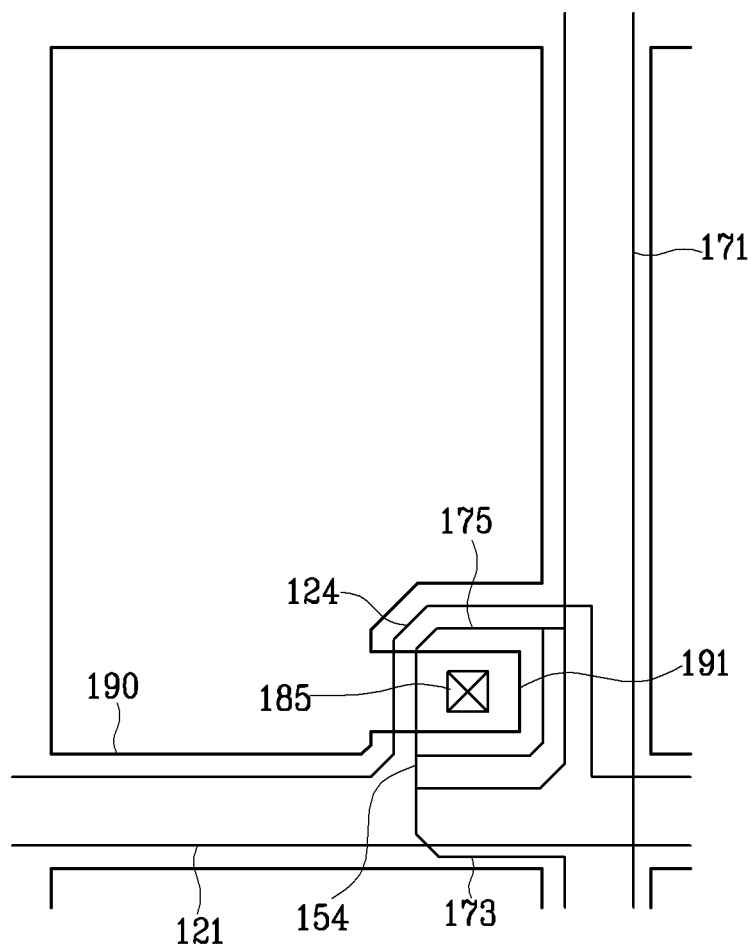
FIG. 13 is a layout view of an exemplary TFT array panel according to another exemplary embodiment of the present invention.
Figure 14:
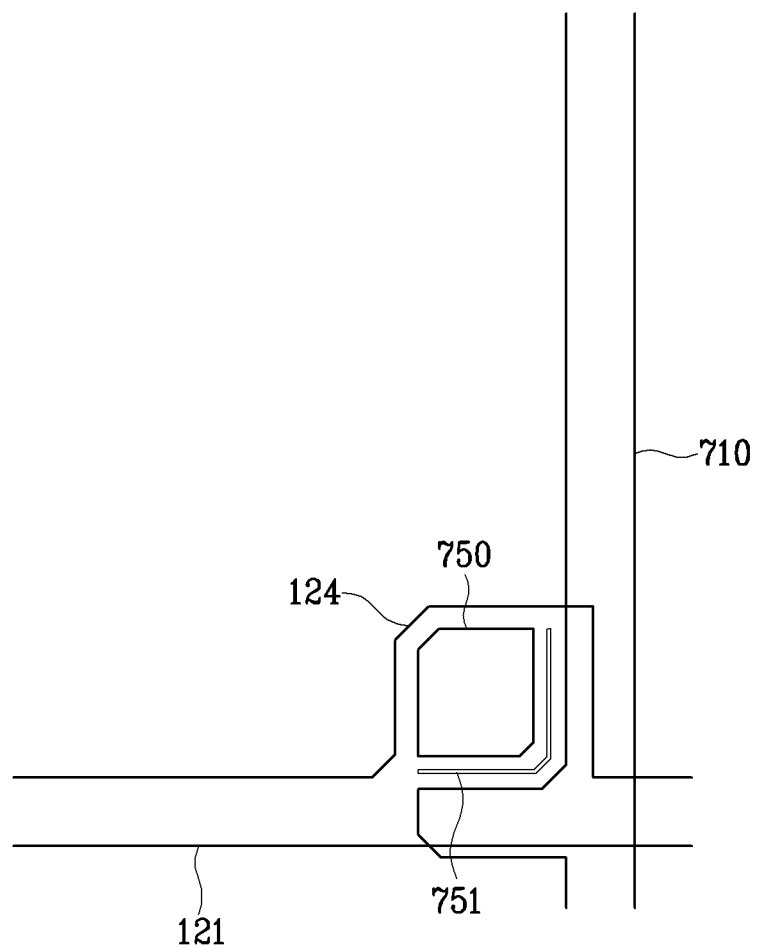
FIG. 14 is a view illustrating an exemplary light mask pattern for use when manufacturing the exemplary TFT array panel shown in FIG. 13.

FIG. 13 is a layout view of an exemplary TFT array panel according to another exemplary embodiment of the present invention and FIG. 14 is a view illustrating an exemplary light mask pattern for using when manufacturing the exemplary TFT array panel shown in FIG. 13.

A layered structure of the TFT array panel shown in FIG. 13 is substantially similar to the ITT array panel shown in FIGS. 1 to 3.

That is, the gate line 121 and the storage electrode line (not shown) are formed on the insulation substrate 110, the gate insulating layer 140 is formed on the gate line 121 and the storage electrode line and the insulation substrate 110, and the ohmic contact layer (not shown) and the semiconductor including the protruding portion 154 are formed on the gate insulating layer 140. The data line 171, including the source electrode 173, and the drain electrode 175 are formed on the ohmic contact layer and the passivation layer (not shown) is formed on the data line 171 and the drain electrode 175. The passivation layer has the contact hole 185 for exposing the drain electrode 175, and the pixel electrode 190 that is connected to the drain electrode 175 through the contact hole 185 is formed on the passivation layer.

At this time, unlike the TFT array panel of FIGS. 1 to 3, the TFT array panel of FIG. 13 has a branch portion 191 which is a portion of the pixel electrode 190 extending toward the drain electrode 175 and the branch portion 191 is connected to the drain electrode 175 through the contact hole 185. Only the branch portion 191 in its layer of the TFT array panel overlaps the gate electrode 124, such that other portions of the pixel electrode 190, not including the branch portion 191, do not overlap the gate electrode 124.

The above-described configuration of the branch portion 191 is provided to prevent a flicker phenomenon due to a kick back voltage by reducing a parasitic capacitance that would otherwise be formed between the pixel electrode 190 and the gate electrode 124. That is, in a case where an overlapping area of the pixel electrode 190 and the gate electrode 124 is wide, the parasitic capacitance formed between them is large. When the parasitic capacitance formed between the pixel electrode 190 and the gate electrode 124 is large, a kick back voltage, which is a phenomenon that a pixel electrode voltage drops depending on the gate voltage drop, is aggravated. Thus, the present embodiment is provided to prevent the phenomenon.

FIG. 14 shows an exemplary light blocking pattern of the exemplary light mask for use in a process of forming the photosensitive film for sequentially depositing a gate insulating layer, a semiconductor layer, an ohmic contact layer, and a data metal layer on an insulation substrate in which the gate line 121 including the gate electrode 124 is formed and patterning all of the data metal layer, the ohmic contact layer, and the semiconductor layer in a state where the photosensitive film is coated on the data metal layer.

As shown in FIG. 14, a slit pattern 751 is disposed between a light blocking pattern 710 for the data line and a light blocking pattern 750 for the drain electrode. In the illustrated embodiment, the slit pattern 751 has a substantially L-shaped configuration and is equidistantly spaced between the light blocking pattern 750 and the light blocking pattern 710. Here, the light blocking pattern 750 for the drain electrode and the slit pattern 751 are disposed within an occupying area of the gate line 121 including the gate electrode 124.

The TFT array panel according to another exemplary embodiment of the present invention will now be described.

Figure 15:
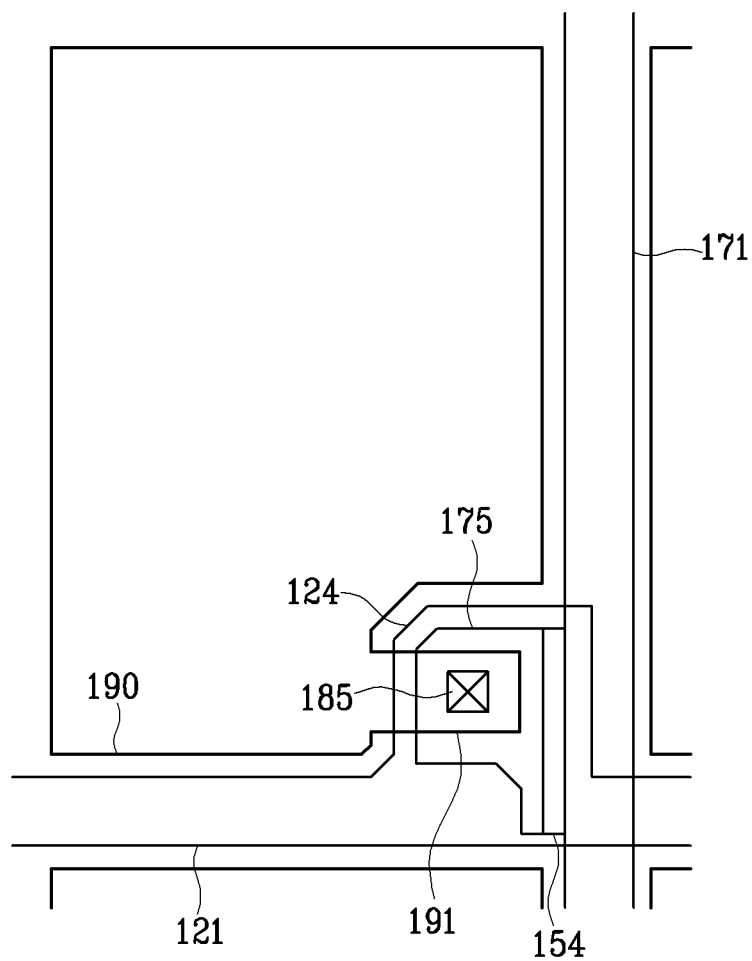
FIG. 15 is a layout view of an exemplary TFT array panel according to another exemplary embodiment of the present invention.
Figure 16:
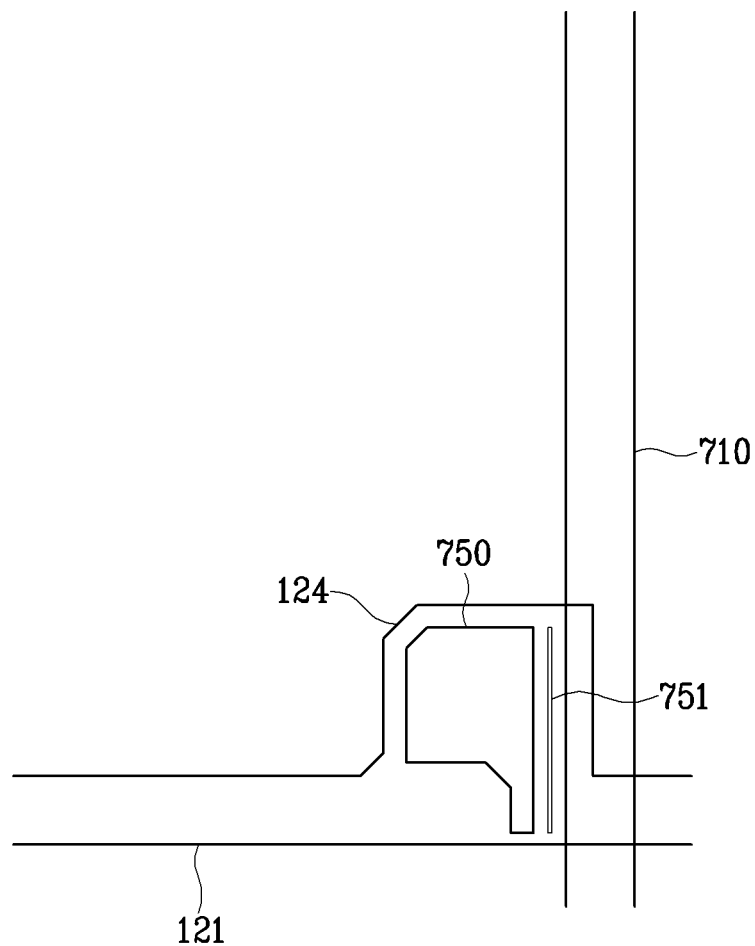
FIG. 16 is a view illustrating an exemplary light mask pattern for use when manufacturing the exemplary TFT array panel shown in FIG. 15.

FIG. 15 is a layout view of an exemplary TFT array panel according to another exemplary embodiment of the present invention and FIG. 16 is a view illustrating an exemplary light mask pattern for using when manufacturing the exemplary TFT array panel of FIG. 15.

The TFT array panel of FIG. 15 has a substantially similar structure as the TFT array panel of FIG. 13.

That is, the gate line 121 and the storage electrode line (not shown) are formed on the insulation substrate 110, the gate insulating layer 140 is formed on the gate line 121 and the storage electrode line and the insulation substrate 110, and the ohmic contact layer (not shown) and the semiconductor including the protruding portion 154 are formed on the gate insulating layer 140. The data line 171 and the drain electrode 175 are formed on the ohmic contact layer and the passivation layer (not shown) is formed on the data line 171 and the drain electrode 175 and the gate insulating layer 140. The passivation layer has a contact hole 185 for exposing the drain electrode 175 and the pixel electrode 190 that is connected to the drain electrode 175 through the contact hole 185 is formed on the passivation layer.

At this time, unlike the TFT array panel of FIG. 13, the TFT array panel of FIG. 15 does not have a source electrode protruding from the data line 171, but has a drain electrode 175 including a protruding portion to increase a width that the drain electrode 175 faces the data line 171. In this way, a channel width of the TFT is fully secured.

FIG. 16 shows an exemplary light blocking pattern of the exemplary light mask for using in a process of forming the photosensitive film for sequentially depositing a gate insulating layer, a semiconductor layer, an ohmic contact layer, and a data metal layer on an insulation substrate in which the gate line 121 including the gate electrode 124 is formed and patterning all of the data metal layer, the ohmic contact layer, and the semiconductor layer in a state where the photosensitive film is coated on the data metal layer.

As shown in FIG. 16, the slit pattern 751 is disposed between the light blocking pattern 710 for the data line and the light blocking pattern 750 for the drain electrode. In the illustrated embodiment, the slit pattern 751 is substantially linear shaped, and is equidistantly spaced between the light blocking pattern 710 and the light blocking pattern 750. Here, the light blocking pattern 750 for the drain electrode and the slit pattern 751 are disposed within an occupying area of the gate line 121 including the gate electrode 124.

The TFT array panel according to another exemplary embodiment of the present invention will now be described.

Figure 17:
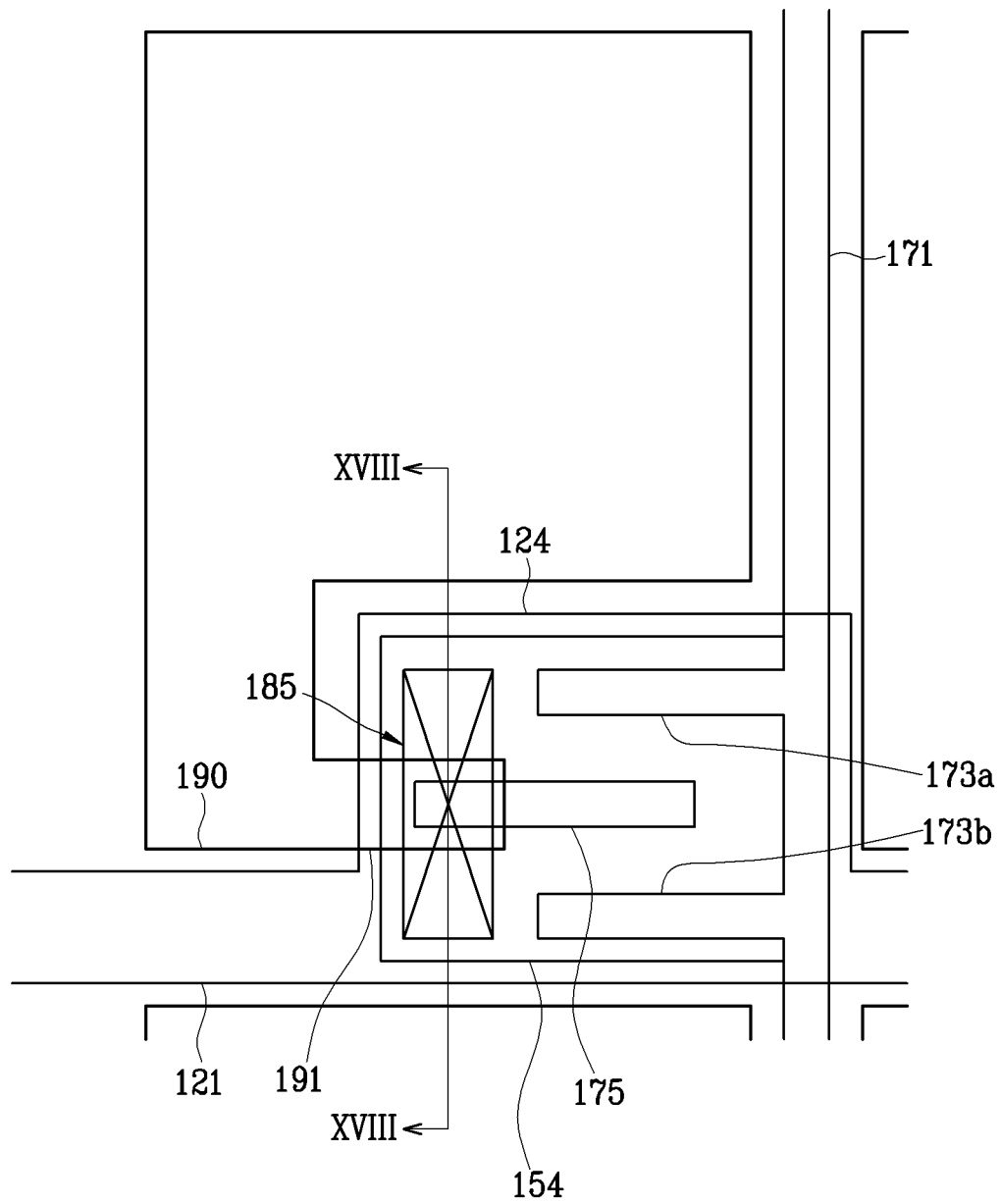
FIG. 17 is a layout view of an exemplary TFT array panel according to another exemplary embodiment of the present invention; and, FIG. 18 is a cross-sectional view of the exemplary TFT array panel taken along line XVIII-XVIII of FIG. 17.
Figure 18:
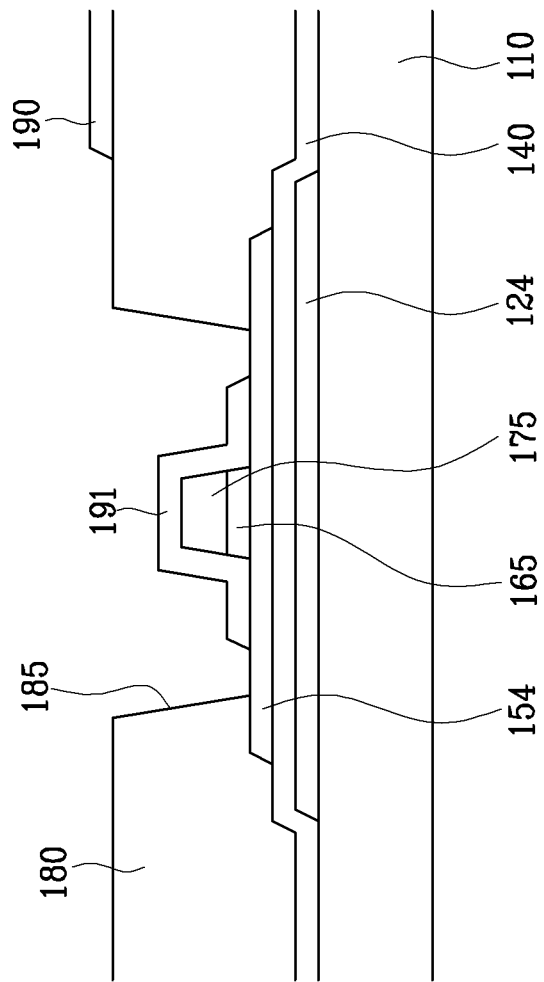

FIG. 17 is a layout view of an exemplary TFT array panel according to another exemplary embodiment of the present invention and FIG. 18 is a cross-sectional view of the exemplary TFT array panel taken along line XVIII-XVIII of FIG. 17.

A layered structure of the ITT array panel shown in FIGS. 17 and 18 is substantially similar to the TFT array panel shown in FIGS. 1 to 3.

That is, the storage electrode line (not shown) and the gate line 121 including the gate electrode 124 are formed on the insulation substrate 110, the gate insulating layer 140 is formed on the gate line 121 and the storage electrode line and the insulation substrate 110, and the ohmic contact and the semiconductor including the protruding portion 154 are formed on the gate insulating layer 140. The data line 171 and the drain electrode 175 including the source electrodes 173a and 173b are formed on the ohmic contact and the passivation layer 180 is formed on the data line 171 and the drain electrode 175 and on the gate insulating layer 140. The passivation layer 180 has the contact hole 185 for exposing the drain electrode 175 and the pixel electrode 190 that is connected to the drain electrode 175 through the contact hole 185 is formed on the passivation layer 180.

At this time, unlike the TFT array panel shown in FIGS. 1 to 3, the TFT array panel shown in FIGS. 17 and 18 has a branch portion 191 in which the pixel electrode 190 is extended toward the drain electrode 175 and the branch portion 191 is connected to the drain electrode 175 through the contact hole 185. This is to prevent a flicker phenomenon due to a kick back voltage by reducing a parasitic capacitance that is formed between the pixel electrode 190 and the gate electrode 124, as previously described with respect to FIG. 13.

Furthermore, source electrodes 173a and 173b are extended from the data line 171 in two sections, the drain electrode 175 is disposed between the two source electrodes 173a and 173b, and the drain electrode 175 is formed in an extended bar shape.

The protruding portion 154 of the semiconductor is extended to lie outside a periphery of the source electrodes 173a and 173b and the drain electrode 175. Therefore, there is an allowance area around the drain electrode 175.

The contact hole 185 exposes an end of the drain electrode 175 that is positioned further from the data line 171 among both ends of the drain electrode 175 and exposes both of the drain electrode 175 and the protruding portion 154 of the semiconductor around the drain electrode 175. Therefore, the branch portion 191 of the pixel electrode 190 comes in contact with an upper surface and a side surface of the drain electrode 175 and comes in contact with the exposed protruding portion 154 of the semiconductor, as shown in FIG. 18.

If the branch portion 191 of the pixel electrode 190 comes in contact with the upper surface and the side surface of the drain electrode 175, electrical contact between the pixel electrode 190 and the drain electrode 175 can be strengthened. For this reason, the contact hole 185 should be formed to expose the drain electrode 175 and surroundings of the drain electrode 175. At this time, an area that is exposed by the contact hole 185 can be limited to an upper part of the semiconductor because the semiconductor is widely distributed around the drain electrode 175. Because the semiconductor can fully increase etching selectivity with the passivation layer 180 that is made of an insulating material, damage of the lower gate insulating layer 140 can be prevented by operating an etching interception layer when the passivation layer 180 is etched so as to form the contact hole 185.

As in the above exemplary embodiments, the protruding portion 154 of the semiconductor is overlapped with the gate electrode 124 and is formed to be disposed within an occupying area of the gate line 121 including the gate electrode 124 in surfaces of the insulation substrate 110. That is, an edge of the protruding portion 154 of the semiconductor is provided within an area that is enclosed with an edge line of the gate line 121 including the gate electrode 124. Therefore, when viewed from the lower side of the insulation substrate 110, the protruding portion 154 is not exposed since it is covered with the gate electrode 124 and the gate line 121.

In the illustrated embodiment, the entire protruding portion 154 is limited in location to staying within the borders of the occupying area of the gate electrode 124. Alternatively, the entire protruding portion 154 of the semiconductor may not necessarily be provided within an occupying area of the gate line 121 including the gate electrode 124. However, it is preferable that a channel portion, which is disposed between the data line 171 including the source electrodes 173a and 173b and the drain electrode 175, a portion disposed under the drain electrode 175, and portions adjacent to the portion disposed under the drain electrode 175 are formed to be disposed within an occupying area of the gate line 121 including the gate electrode 124. That is, it is preferable that a semiconductor that is positioned toward the drain electrode 175 from the data line 171 is provided within an occupying area of the gate line 121 including the gate electrode 124.

According to exemplary embodiments of the present invention, a leakage current can be prevented from being generated by covering a semiconductor constituting the ITT with a gate metal layer and irradiating backlight in the semiconductor.

Furthermore, as a contact hole for connecting the pixel electrode and the drain electrode is widely formed on the semiconductor, connection between the pixel electrode and the drain electrode can be strengthened.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
   an insulation substrate extending in a plane substantially parallel to X and Y directions;
   a gate line formed on the insulation substrate and including a gate electrode;
   a data line insulated from and intersecting the gate line, and including a source electrode;
   a drain electrode disposed opposite to the source electrode; and
   a semiconductor formed in a layer between the data line and the gate line in a Z direction perpendicular to the X and Y directions, the semiconductor having a linear portion extending along the data line in the Y direction and disposed below the data line in the Z direction and having a protruding portion protruding from the linear portion in a direction substantially parallel to the plane substantially parallel to the X and Y direction and disposed below the drain electrode in the Z direction,
   wherein the entire area of the protruding portion of the semiconductor in the plane substantially parallel to the X and Y direction overlaps an occupying area of the gate line including the gate electrode so that the gate line covers the entire protruding portion of the semiconductor in the plane substantially parallel to the X and Y directions to block light from outside in the Z direction reaching the protruding portion of the semiconductor, and
   wherein an entire outer periphery defining the entire drain electrode in the plan view is disposed within an outer boundary of an occupying area of the gate line including the gate electrode in the plan view.

2. The thin film transistor array panel of claim 1, further comprising a pixel electrode connected to the drain electrode.

3. The thin film transistor array panel of claim 2, wherein the pixel electrode has a branch portion extended toward the drain electrode and the branch portion is connected to the drain electrode.

4. The thin film transistor array panel of claim 3, wherein only the branch portion of the pixel electrode overlaps with the gate line.

5. The thin film transistor array panel of claim 2, wherein the pixel electrode contacts an upper surface and a side surface of the drain electrode.

6. The thin film transistor array panel of claim 5, wherein the pixel electrode contacts the semiconductor.

7. A thin film transistor array panel comprising:
   an insulation substrate extending in a plane substantially parallel to X and Y directions;
   a gate line formed on the insulation substrate and including a gate electrode;
   a gate insulating layer formed on the gate line;
   a semiconductor formed on the gate insulating layer in a Z direction perpendicular to the X and Y directions, the semiconductor comprising a stripe portion and a protruding portion protruding from the stripe portion in a direction substantially parallel to the plane substantially parallel to the X and Y direction and overlapping the gate electrode;
   a data line formed on the semiconductor stripe and intersecting the gate line, the data line including a source electrode;
   a drain electrode formed on the protruding portion of the semiconductor stripe;
   a passivation layer formed on the data line and the drain electrode in the sectional view and having a contact hole exposing the drain electrode; and
   a pixel electrode formed on the passivation layer in the sectional view and connecting to the drain electrode through the contact hole,
   wherein the entire area of the protruding portion of the semiconductor in the plane substantially parallel to the X and Y directions overlaps an occupying area of the gate line including the gate electrode in the plane substantially parallel to the X and Y direction so that the gate line covers the entire protruding portion of the semiconductor to block light form outside in the Z direction reaching the protruding portion of the semiconductor, wherein an entire outer periphery defining the entire drain electrode in the plan view is disposed within an outer boundary of an occupying area of the gate line including the gate electrode in the plan view.

8. The thin film transistor array panel of claim 7, wherein the pixel electrode has a branch portion extended toward the drain electrode and the branch portion is connected to the drain electrode.

9. The thin film transistor array panel of claim 8, wherein only the branch portion of the pixel electrode overlaps with the gate line.

10. The thin film transistor array panel of claim 7, wherein the contact hole exposes the drain electrode and portions of the protruding portion of the semiconductor around the drain electrode.

11. The thin film transistor array panel of claim 10, wherein the pixel electrode contacts an upper surface and a side surface of the drain electrode exposed through the contact hole.

12. The thin film transistor array panel of claim 11, wherein the pixel electrode comes in contact with the portions of the protruding portion of the semiconductor that are exposed through the contact hole.

13. The thin film transistor array panel of claim 12, wherein the pixel electrode has a branch portion and the branch portion is connected to the drain electrode and the semiconductor.

14. The thin film transistor array panel of claim 13, wherein only some of the portions of the protruding portion of the semiconductor exposed through the contact hole are covered with the pixel electrode.

* * * * *